United States Patent
Rose et al.

(10) Patent No.: US 9,371,425 B2
(45) Date of Patent: *Jun. 21, 2016

(54) PROCESS FOR MANUFACTUING A FILLED POLYMERIC MATERIALS WITH MODIFIED FILLER PARTICLES

(71) Applicant: E. I. DU PONT DE NEMOURS AND COMPANY, Wilmington, DE (US)

(72) Inventors: Jeffrey Michael Rose, Amherst, NY (US); Clyde Spencer Hutchins, Colden, NY (US); Timothy Scott Wyant, Cheektowaga, NY (US); Christopher P. Karwas, Lake View, NY (US)

(73) Assignee: E I DU PONT DE NEMOURS AND COMPANY, Wilmington, DE (US)

(*) Notice: Subject to any disclaimer, the term of this patent is extended or adjusted under 35 U.S.C. 154(b) by 0 days.

This patent is subject to a terminal disclaimer.

(21) Appl. No.: 14/410,855

(22) PCT Filed: Jul. 1, 2013

(86) PCT No.: PCT/US2013/048847
§ 371 (c)(1),
(2) Date: Dec. 23, 2014

(87) PCT Pub. No.: WO2014/008149
PCT Pub. Date: Jan. 9, 2014

(65) Prior Publication Data
US 2015/0166739 A1    Jun. 18, 2015

Related U.S. Application Data

(60) Provisional application No. 61/667,163, filed on Jul. 2, 2012.

(51) Int. Cl.
| | |
|---|---|
| *C08J 3/20* | (2006.01) |
| *C09C 1/40* | (2006.01) |
| *C08K 9/02* | (2006.01) |
| *C08K 3/04* | (2006.01) |
| *C08K 3/22* | (2006.01) |
| *C09C 1/56* | (2006.01) |
| *C09C 1/24* | (2006.01) |
| *C09C 1/30* | (2006.01) |
| *C09C 3/04* | (2006.01) |
| *C09C 3/10* | (2006.01) |
| *H01L 51/44* | (2006.01) |
| *C08F 220/14* | (2006.01) |
| *C08L 33/12* | (2006.01) |

(52) U.S. Cl.
CPC . *C08J 3/203* (2013.01); *C08K 3/04* (2013.01); *C08K 3/22* (2013.01); *C08K 9/02* (2013.01); *C09C 1/24* (2013.01); *C09C 1/3045* (2013.01); *C09C 1/40* (2013.01); *C09C 1/407* (2013.01); *C09C 1/56* (2013.01); *C01P 2002/52* (2013.01); *C01P 2004/03* (2013.01); *C01P 2004/61* (2013.01); *C01P 2004/62* (2013.01); *C01P 2006/22* (2013.01); *C08F 220/14* (2013.01); *C08J 2333/12* (2013.01); *C08K 2003/2227* (2013.01); *C08K 2003/2265* (2013.01); *C08L 33/12* (2013.01); *C09C 3/041* (2013.01); *C09C 3/10* (2013.01); *H01L 51/447* (2013.01)

(58) Field of Classification Search
CPC .............. C09J 3/20; C09J 3/203; C08K 3/22; C08K 3/04; C08K 9/02; C09C 1/407; C09C 1/56; C09C 1/24; C09C 1/3045; C09C 1/40; C09C 3/041; C09C 3/10; H01L 51/447; C01P 2004/03; C01P 2004/61; C01P 2004/62; C01P 2006/22
USPC .......................................................... 524/431
See application file for complete search history.

(56) References Cited

U.S. PATENT DOCUMENTS

| | | | | |
|---|---|---|---|---|
| 3,847,865 | A | | 11/1974 | Duggins |
| 4,915,987 | A | * | 4/1990 | Nara ......................... B01F 7/04 241/189.1 |
| 5,286,290 | A | | 2/1994 | Risley |
| 5,336,309 | A | * | 8/1994 | Noguchi .............. A61K 8/0254 106/31.33 |
| 5,665,425 | A | * | 9/1997 | Nishibori ................ B29B 15/08 427/180 |
| 6,280,842 | B1 | * | 8/2001 | Nishibori ................ B29B 15/08 428/143 |
| 7,863,369 | B2 | | 1/2011 | Bianchi et al. |
| 2003/0071387 | A1 | † | 4/2003 | Beitelshees |
| 2007/0104952 | A1 | | 5/2007 | Bianchi et al. |

FOREIGN PATENT DOCUMENTS

| | | | | |
|---|---|---|---|---|
| EP | 0306331 | A2 * | 3/1989 | .......... G03G 9/0825 |
| JP | EP 0306331 | A2 * | 3/1989 | .......... G03G 9/0825 |

OTHER PUBLICATIONS

Patent Abstracts of Japan, Publication No. 62-030133, published Sep. 2, 1987 "Hydrate of Colored Metal Oxide", Mitsubishi.

\* cited by examiner
† cited by third party

*Primary Examiner* — Michael M Bernshteyn

(57) ABSTRACT

The invention pertains to filler modified with functional particles in a dry-blending process through collisions of sufficient energy to bound, adhere, or otherwise associate the pigment particles to the filler, and a filled polymeric material manufactured with the modified filler.

7 Claims, 25 Drawing Sheets

PROCESS FOR MANUFACTUING A FILLED POLYMERIC MATERIALS WITH MODIFIED FILLER PARTICLES

BACKGROUND OF THE INVENTION

In general, filled polymer materials are desirable for use in a variety of applications, such as consumer products and polymer composite building materials. Filled polymer materials often employ colorants to improve the appearance and aesthetic character of the objects into which they are formed. Typically, pigments or dyes are added to the polymer before it is blended with the filler. However, colored filled polymer materials are known to fade and undergo aesthetically displeasing color changes. One form of aesthetically displeasing color change is known as "whitening". When objects formed from colored filled polymer materials are exposed to physical damage, such as scratching, impact, and bending, they are known to change to a white color. The typical mineral fillers that are used are white in color and it is generally understood that the whitening is a result of the white filler becoming exposed at the surface of the object.

In U.S. Pat. No. 7,863,369 Bianchi et al disclose a colored filled polymer material formed of a polymer matrix and a pigment. The pigment includes alumina hydrate particulate having a dye covalently bonded to the surface of the alumina hydrate particulate. However, materials made according to the disclosure of Bianchi are known to blotch and whiten to an unacceptable degree.

Accordingly, there is a continued need within the industry to provide colored filled polymer materials having improved resistance to whitening due to physical damage.

In addition, dispersion of traditional pigments with polymer materials is difficult. Poor dispersion leads to swirling and color variability with the colored polymer material. Further, poor dispersion of the pigment within the plastic article may lead to undesirable mechanical properties. As such, compatibilizers are typically used to disperse pigment within a polymer material. Such compatibilizers include a variety of organic compounds that aid in dispersing the pigment. However, compatibilizers typically are expensive and may also negatively influence mechanical properties of the filled polymer material. In addition, pigments are dispersed in liquid prepolymer mixture using high shear mechanical processes which negatively impact the prepolymer and require the prepolymer mixture to be deaerated.

In Japanese Patent Application Publication Number 1987030133(A), Kaide discloses a colored resin composite made from abundant blending of colorant with a hydrate of metal oxide beforehand, from which damaged parts do not experience a whitening phenomenon. However, Kaide discloses a colored hydrate of a metal oxide that is blended with a high molecular weight plastic or rubber material to yield a composite. The present invention is a filler modified with particles with an association that is strong enough to withstand subsequent processing, in particular suspension and mixing in a polar liquid medium (e.g. methyl methacrylate). A polar liquid media provides a more aggressive environment than the one disclosed in Kaide, and therefore a more challenging one for modified filler to persist.

Accordingly, there is a continued need within the industry for improved dispersion of colorants and fillers in filled polymer materials wherein the filler and modifying materials will withstand processing forces.

FIELD OF THE INVENTION

The present invention is related to filler material for polymer composites.

SUMMARY OF THE INVENTION

One embodiment of the invention is a modified filler particle comprising a filler particle modified with discrete functional particles that are sufficiently bound, adhered, or otherwise associated to the filler such that they are able to remain associated during subsequent manufacturing steps.

Another embodiment of the invention is a modified filler particle comprising a filler particle modified with pigment particles that are sufficiently bound, adhered, or otherwise associated to the filler such that they are able to remain associated during subsequent manufacturing steps.

Another embodiment of the invention is a filled polymeric material comprising polymer at least partially filled with filler particles that are modified with functional particles by blending them in a blending process wherein the collisions are of sufficient energy to bound, adhere, or otherwise associate the functional particles to the filler.

DEFINITIONS

Figure 1A:
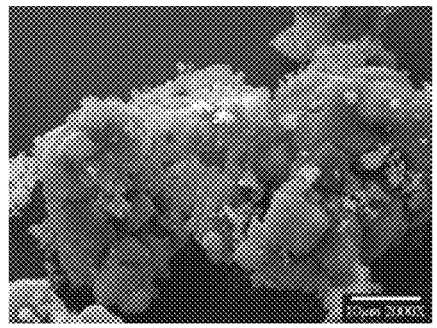
FIG. 1 shows SEM micrographs comparing unmodified ATH and ATH modified with various pigments.
Figure 1B:
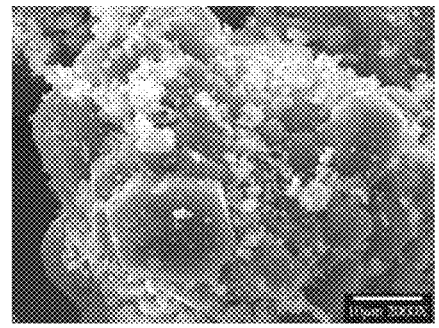
Figure 1C:
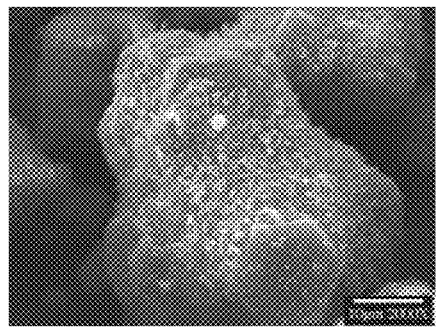
Figure 1D:
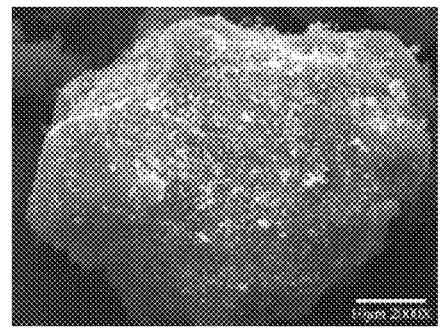
Figure 1E:
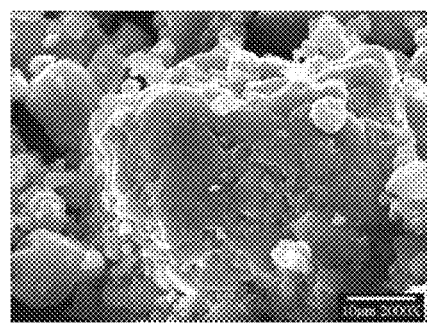
Figure 1F:
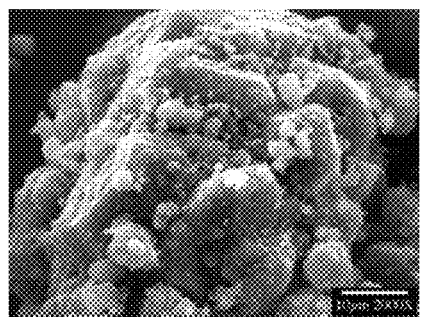
Figure 1G:
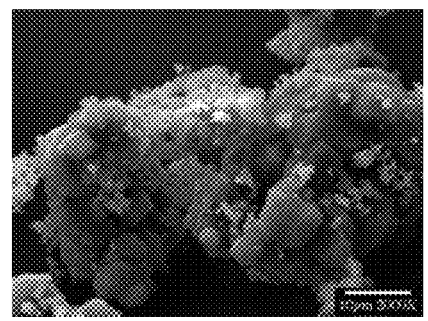
Figure 1H:
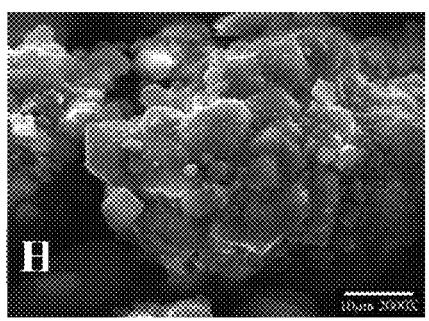
Figure 1I:
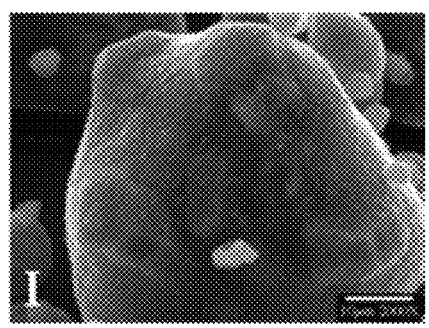
Figure 2A:
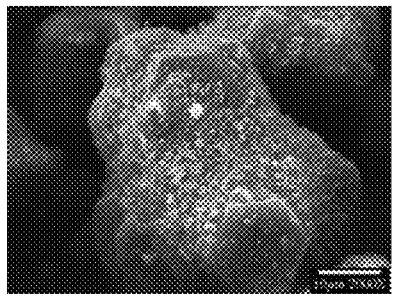
FIG. 2 shows SEM micrographs comparing unmodified ATH, iron oxide black pigment, and ATH modified with iron oxide black pigment via dry-blending.
Figure 2B:
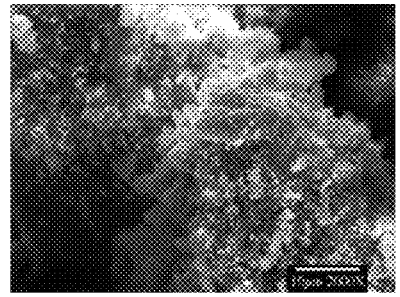
Figure 2C:
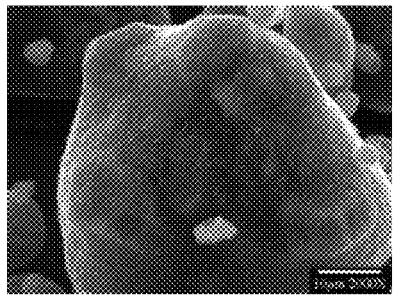
Figure 2D:
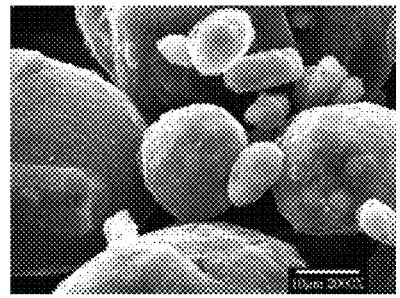
Figure 2E:
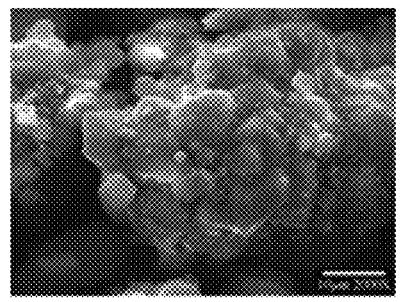
Figure 2F:
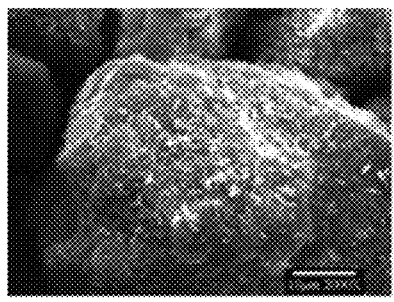

As employed herein, the term "solid surface material" is employed in its normal meaning and represents a three dimensional material such as a material particularly useful in the building trades for kitchen countertops, sinks and wall coverings wherein both functionality and an attractive appearance are necessary. In general, solid surface materials are composite materials comprised of a polymeric matrix and mineral filler.

As employed herein, the term "dye" means a colorant that, in general, is soluble in the medium in which it is used, and therefore not of a particulate nature but rather a multiplicity of solvated molecules.

As employed herein, the term "pigment" means a colorant that is insoluble in the medium in which it is used, and therefore of a particulate nature encompassing the physical and chemical properties thereof (e.g. surface charge, surface chemistry, and topology).

As employed herein, the term "filler" means any material that is solid at room temperature and atmospheric pressure, used alone or in combination, and which is insoluble in the various ingredients of the composition, even when these ingredients are raised to a temperature above room temperature and in particular to their softening point or their melting point.

As employed herein, the term "calcined ATH" means, alumina trihydrate (ATH) which has been prepared by a thermal treatment process to remove water from its surface.

As employed herein, the term "discrete functional particle" means a material that is 1) not soluble in the medium in which it is used and therefore in that medium does not exist as a multiplicity of individual solvated molecules and 2) one that can modify another solid material.

As described herein, the term "modified" means having associated one or more discrete functional particles.

As employed herein, the term "associated" means held in close proximity to a surface via an interaction including both non-bonding interactions, such as van der waals forces, ion-dipole interactions, dipole-dipole interactions, capillarity, and electrostatic interactions, and also bonding interactions, such as covalent bonding, ionic bonding, hydrogen bonding, metallic bonding, acid-base interactions, Pearson-type acid-base interactions, and dative (coordinate covalent) bonding.

DETAILED DESCRIPTION OF THE INVENTION

A first embodiment of the invention provides a filler particle modified with discrete functional particles for incorporation into filled polymer materials. The filler particle is modified with discrete functional particles by dry-blending discrete functional particles and filler in a high energy mixing process prior to incorporating the resulting modified filler into a liquid prepolymer mix. It is found that the dry-blending of discrete functional particles with filler prior to incorporation into a liquid prepolymerized mixture provides for a modified filler particle with improved processing and performance characteristics. The energy imparted by the blending process must be of sufficient energy to bound, adhere, or otherwise associate the functional particles to the filler.

Another embodiment of the invention provides a filler particle modified with pigment particles for incorporation into filled polymer materials. The filler particle is modified with pigment by dry-blending discrete pigment particles and the filler by employing a high energy mixing process prior to incorporating the resulting modified filler into a liquid prepolymer mix. The energy imparted by the dry-blending process must be of sufficient energy to bound, adhere, or otherwise associate the pigment particles to the filler. It is found that the dry-blending of pigment particles with filler prior to incorporation into a liquid prepolymerized mixture provides for a pigmented filler particle with improved processing and performance characteristics when compared to dyeing the filler, or by incorporating a liquid pigment dispersion to a prepolymerized mix. It is also found that objects made with filled polymer materials employing the dry-blended pigment-modified filler have improved resistance to whitening due to physical damage. It is also found that the dry-blending of pigment with filler prior to incorporation into a liquid prepolymerized mixture provides improved dispersion of colorants in colored filled polymer materials wherein the modified filler will withstand processing forces better than dyed filler or liquid pigment dispersions. It is also found that dry-blending modified filler particles provides a means for introducing a high loading of pigment, to a level that direct addition of pigment does not permit. High pigment loading via dry-blended filler is found to be economical and convenient, whereas it is found that adding a high level of pigment via a traditional dispersion is costly and impractical given the relatively low concentration of pigment that can be dispersed by those skilled in the art.

Another embodiment of the invention provides filled polymeric materials comprising polymer at least partially filled with filler particles that are modified with functional particles by blending them in a dry-blending process wherein the collisions are of sufficient energy to bound, adhere, or otherwise associate the functional particles to the filler. The dry-blending process is done prior to incorporating the resulting modified filler into a liquid prepolymer mix. Various functional properties are incorporated into the filled polymer material dependent on the material used to modify the filler. It is found that dry-blending discrete particles and a filler in a high energy mixing process prior to incorporation into liquid prepolymer mixture provides a filler particle that more strongly bonds with the discrete functional particles than will be the case for dyed filler or filler that is mixed with discrete functional particles in a low energy mixing process.

The modified filler particle includes particulate filler. In general, this filler increases the hardness, stiffness or strength of the final article relative to the pure polymer or combination of pure polymers. The filler is insoluble in the various ingredients of typical liquid prepolymers. Some representative fillers include alumina, alumina trihydrate (ATH), alumina monohydrate, aluminum hydroxide, aluminum oxide, aluminum sulfate, aluminum phosphate, aluminum silicate, Bayer hydrate, borosilicates, calcium sulfate, calcium silicate, calcium phosphate, calcium carbonate, calcium hydroxide, calcium oxide, apatite, quartz, quartzite, silica (SiO$_2$, including sand), glass bubbles, glass microspheres, glass fibers, glass beads, glass flakes, glass powder, glass spheres, carbon fibers, ceramic fibers, metal fibers, polymer fibers, nano-wood fibers, carbon nanotubes, graphene, clay, barium carbonate, barium hydroxide, barium oxide, barium sulfate, barium phosphate, barium silicate, magnesium sulfate, magnesium silicate, magnesium phosphate, magnesium hydroxide, magnesium oxide, kaolin, montmorillonite, bentonite, pyrophyllite, mica, gypsum, ceramic microspheres and ceramic particles, powder talc, titanium dioxide, diatomaceous earth, wood flour, borax, silicon carbide, Portland cement, or combinations thereof. The filler is present in the form of small particles, with an average particle size in the range of from about 0.1-500 microns. The preferred filler is a mineral particle. A particularly preferred filler is alumina trihydrate. Another particularly preferred filler is quartz.

The modified filler particle includes discrete functional particles. The functional particles may be any natural or synthetic, organic or inorganic matter, usually in the form of an insoluble powder. Functional particles may be any combination of functional particles.

A preferred discrete functional particle is pigment. When the filler is modified with pigment and the subsequent modified filler particle is incorporated into a polymeric material, it is found to impart improved colorant characteristics. When modifying the filler with pigment, the preferred pigments are iron oxides and carbon black.

Other useful discrete functional particles are energy absorption modifiers. Energy absorption modifiers include UV absorption modifiers, UV stabilization modifiers, IR absorption modifiers, radiofrequency wave absorption modifiers, fluorescent response modifiers, phosphorescent response modifiers, thermochromism modifiers, electrical conductivity modifiers, magnetic characteristic modifiers, or any combination thereof.

Other useful discrete functional particles are mechanical property modifiers. Mechanical property modifiers include surface hardness modifiers, lubricity modifiers, strength modifiers, toughness modifiers, impact resistance modifiers, scratch resistance modifiers, mar resistance modifiers, and any combination thereof.

Other useful discrete functional particles are materials that modify the surface properties of the filler particles. Surface property modifiers include stain resistance modifiers, lubricity modifiers, adhesion modifiers, absorbability modifiers, flame retardants, antimicrobial agents, modifiers of self-cleanability, modifiers of self-healing of a polymeric matrix comprising the modified filler particle, acidity or alkalinity modifiers, modifiers of electrical characteristics, modifiers of magnetic properties, or any combination thereof.

Other useful discrete functional particles are materials that modify the interaction of the filler particles with a surrounding medium when the modified filler particle is added to the medium. Useful materials include surface tension modifiers, rheology modifiers, modifiers of the agglomeration state of the modified filler particle, modifiers of the packing efficiency of the modified filler particle, compatibilizers, dispersants, or any combination thereof.

In the present invention, particles are present in two different size distributions. It is considered that the benefits of modifying the filler particle with functional particles do not occur to the desired degree if the particle size distribution is not present. A particle size distribution for the filler is in a range from 0.1 micron to 100 microns, more preferably 7 to 100, and most preferably 10 to 50 microns.

A particle size distribution for the functional particles is from 0.005 microns to 4 microns, more preferably from 0.01 to 3 microns. It is believed that most commercial pigments are in the 0.2 to 3 micron range.

The ratio of the filler to the functional particles may range on a weight basis from 99.9:0.1 up to 10:90.

The dry-blending process employs a high energy mixing process. A high energy mixing process mixes the functional particles and filler to a homogeneous mixture in 60 minutes or less. Without being bound to theory, it is believed that a high energy mixing process creates a bond between pigment and filler that is stronger than low energy mixing processes. A suitable high shear mixing process is an air driven pitch-blade turbine with a high shaft speed. A suitable shaking process employs a paint shaker run at a high speed. Optional mixing processes include microwave blending, shaking, tumbling, milling (jet, ball), supercritical fluids, homogenizer, electrostatic fields, magnetic fields, horizontal plough mixer, vertical high intensity mixer, horizontal or vertical blade mixer, EIRICH-type mixer, pin mill, hammer mill, fluidized bed, vibratory, sonication, blenders (V-shaped, double cone), or a combination thereof.

The preferred use of the dry-blended modified filler of the present invention is in a solid surface material. Solid surface materials are filled polymeric materials and various methods for their manufacture are known in the art. The preferred solid surface material is an acrylic containing composition. The preparation of a polymerizable acrylic composition consisting essentially of a sirup containing methyl methacrylate polymer dissolved in monomeric methyl methacrylate (polymer-in-monomer syrup), a polymerization initiator, and inorganic filler, preferably alumina trihydrate, is disclosed in U.S. Pat. No. 3,847,865 issued to Ray B. Duggins. The composition can be cast or molded and cured to produce a sheet structure with an important combination of properties including translucency, weather resistance, resistance to staining by common household materials, flame resistance, and resistance to stress cracking. In addition, the cured article can be easily machined by conventional techniques including sawing and sanding. This particular combination of properties makes such a structure particularly useful as kitchen or bathroom countertops, back splash panels, molded articles such as towel racks, and the like. The polymer constituent comprises 15 to 80%, preferably 20 to 45% by weight of the filled article and may comprise methyl methacrylate homopolymers and copolymers of methyl methacrylate with other ethylenically unsaturated compounds (e.g., vinyl acetate, styrene, alkyl acrylates, acrylonitrile, alkyl methacrylates, multifunctional acrylic monomers such as alkylene dimethacrylates and alkylene diacrylates). In addition, the polymer constituent can contain small amounts of other polymers including minor amounts of polyester. The solid surface material also contains 20 to 85%, preferably about 55 to 80% of filler. The preferred filler is the dry-blended filler of the present invention. Optional materials generally used as fillers may be combined in the liquid prepolymer mixture along with the dry-blended filler, for example, titanates, barium sulfates, calcium carbonate, lithopone, china clays, magnesite, mica, iron oxides, silicone dioxide, and various siennas. Optionally, the solid surface material may contain macroscopic decorative particles known to the industry as "crunchies". Crunchies are various filled and unfilled, pigmented or dyed, insoluble or crosslinked chips of polymers such as ABS resins, cellulose esters, cellulose ethers, epoxy resins, polyethylene, ethylene copolymers, melamine resins, phenolic resins, polyacetals, polyacrylics, polydienes, polyesters, polyisobutylenes, polypropylenes, polystyrenes, urea/formaldehyde resins, polyureas, polyurethanes, polyvinyl chloride, polyvinylidene chloride, polyvinyl esters and the like. Other useful macroscopic translucent and transparent decorative particles are natural or synthetic minerals or materials such as agate, alabaster, albite, calcite, chalcedony, chert, feldspar, flint quartz, glass, malachite, marble, mica, obsidian, opal, quartz, quartzite, rock gypsum, sand, silica, travertine, wollastonite and the like; cloth, natural and synthetic fibers; and pieces of metal. When incorporating the dry-blended modified filler into liquid prepolymer mixtures, various filler materials modified with various pigment materials may be combined. Optional uses of the dry-blended filler include cable coating, carpet backing, and concrete.

The dry-blended modified filler may be combined with polymeric matrices using processes other than liquid prepolymer, such as casting, melt processing, powder coating, solution processing, slip casting, tape casting, vibrocompaction, compression molding, sintering, extrusion, and injection molding.

The following examples are included as representative of the embodiments of the present invention.

EXAMPLES

Example 1

Modification of ATH with Pigment Particles Via Shearing

In eight separate preparations, a 1-quart vessel was charged with 217.5 g of alumina trihydrate (Alcan WH-311). While stirring at 500 RPM with a four-blade air driven pitch-blade turbine, 32.5 g of a given solid pigment was added over the course of 15 minutes. Mixing was continued until the mixture appeared to be homogenously colored. SEM micrographs were acquired for each sample of modified filler:

| Pigment | Fig. of SEM Micrograph |
| --- | --- |
| NONE; unmodified ATH | 1A |
| BASF Magnetic Black S 0045 | 1B |
| Iron Oxide Yellow 1888D | 1C |
| Kroma Red 3097 | 1D |
| Irgazin Blue 3367 | 1E |
| Monolite Green 751 | 1F |
| Meteor Bright Yellow 8320 | 1G |
| Quinacridone Red Violet 19 | 1H |
| Arosperse F138 Carbon Black | 1I |

The micrographs demonstrate that a shearing process is effective in modifying a filler with a pigment, and that the dry-blending process works on organic, inorganic and carbon black pigments.

Each of the eight samples of the dry-blended pigment-modified fillers was then subjected to washing in methyl methacrylate to ensure persistence of the pigment modification in a manufacturing process. Specifically, the test is designed to determine if the pigment would disassociate from the filler and cause color blotches in objects made from liquid prepolymers incorporating the modified filler. In each case, 10.0 g of the modified filler was placed in a 40-mL glass vial. To this was added 30.0 g of methyl methacrylate. The vials were capped and placed on a wrist-action shaker table for four hours. The fully-suspended mixtures were cast into shallow aluminum pans. The bulk methyl methacrylate was allowed to evaporate. Following this, the samples were placed in a drying oven at 45° C. for one hour. The temperature of the oven was increased ~10° C. every hour for four hours. The total drying time was 6 hours. Visual inspection confirmed that for all eight samples the pigment remained on the filler. The micrographs show that the pigment persisted with an association that is strong enough to withstand subsequent processing, in particular suspension and mixing in a polar liquid medium. SEM micrographs were acquired for three of the dried samples:

| | FIG. Reference | |
| --- | --- | --- |
| Sample | Initial Sample | Washed, Cast, and Dried Sample |
| ATH Modified with Iron Oxide Yellow 1888D | 2A | 2B |
| ATH Modified with Arosperse F138 Carbon Black | 2C | 2D |
| ATH Modified with Quinacridone Red Violet 19 | 2E | 2F |

Example 2

Modification of ATH with Iron Oxide Black Via Shaking

Figure 3A:
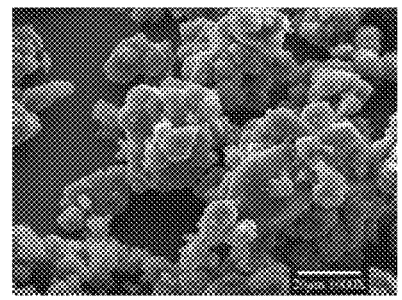
FIG. 3 shows SEM micrographs comparing unmodified ATH, carbon black pigment, and ATH modified with carbon black pigment via shaking.
Figure 3B:
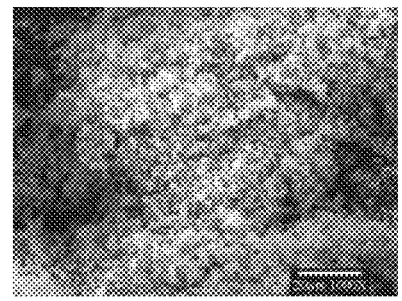
Figure 3C:
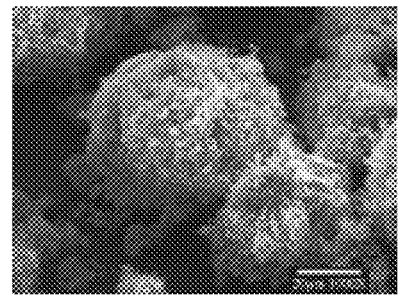

A one-gallon paint can was charged with 1,500 g ATH and 714.3 g Bayferrox 318NM (iron oxide black). The vessel was sealed and then shaken on a Red Devil single-arm paint shaker for 30 minutes at which point the components appeared to be homogeneously blended. The sample was analyzed by SEM (FIG. 3C). The micrograph shows the presence of relatively small iron oxide black particles on the surface of the relatively large ATH particles. This demonstrates that a shaking process is effective in modifying a filler with a functional particle.

Example 3

Modification of Quartz with Iron Oxide Black Via Shaking

Figure 4A:
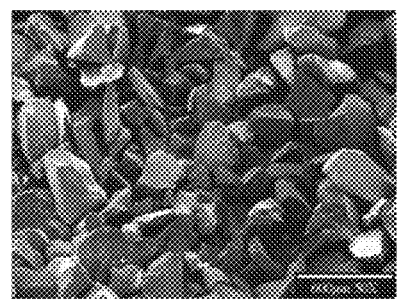
FIG. 4 shows SEM micrographs of Modification of quartz with iron oxide black via shaking.
Figure 4B:
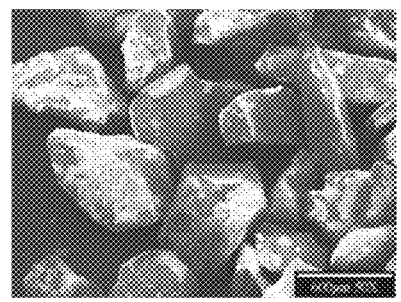

A one-gallon paint can was charged with 217.5 g of Blackburn 84 mesh quartz and 32.5 g of Bayferrox 318NM (iron oxide black). The vessel was sealed and then shaken on a Red Devil single-arm paint shaker for 30 minutes at which point the components appeared to be homogeneously blended. The sample was analyzed by SEM (FIG. 4B) along with an unmodified sample of quartz (FIG. 4A) The micrographs show the presence of relatively small iron oxide black particles evenly distributed on the surface of the large quartz particles, indicating a homogeneous blend.

Figure 4C:
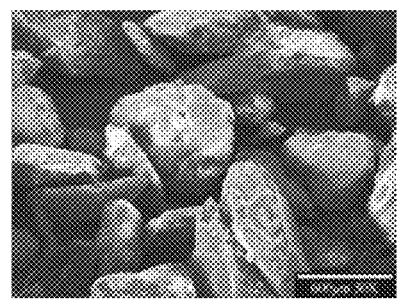

The modified sample was subjected to the methyl methacrylate washing procedure of Example 1. An SEM micrograph of the washed, cast, and dried sample was acquired (FIG. 4C). The micrograph shows that the pigment modification persisted with an association that is strong enough to withstand subsequent processing, in particular suspension and mixing in a polar liquid medium.

Example 4

Modification of Portland Cement with Iron Oxide Black Via Shaking

Figure 5:
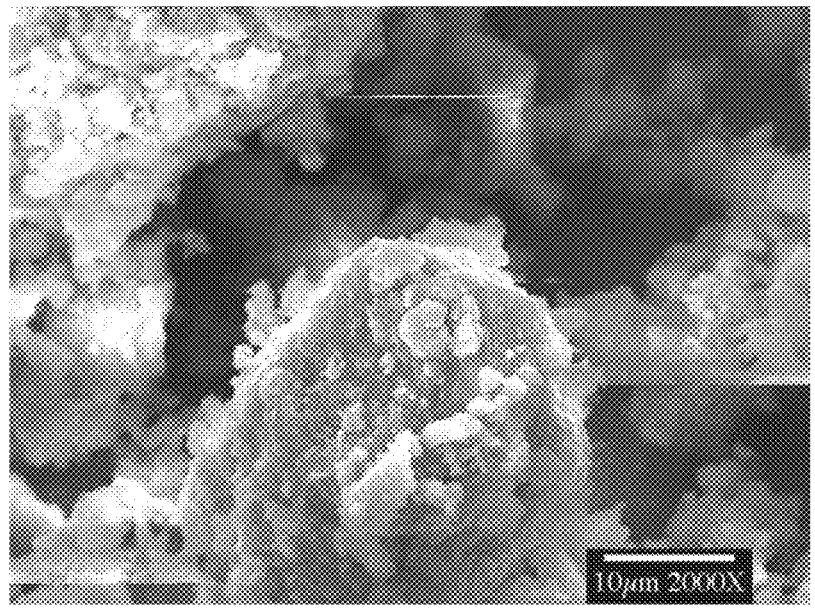
FIG. 5 shows an SEM micrograph of Portland cement.
Figure 6:
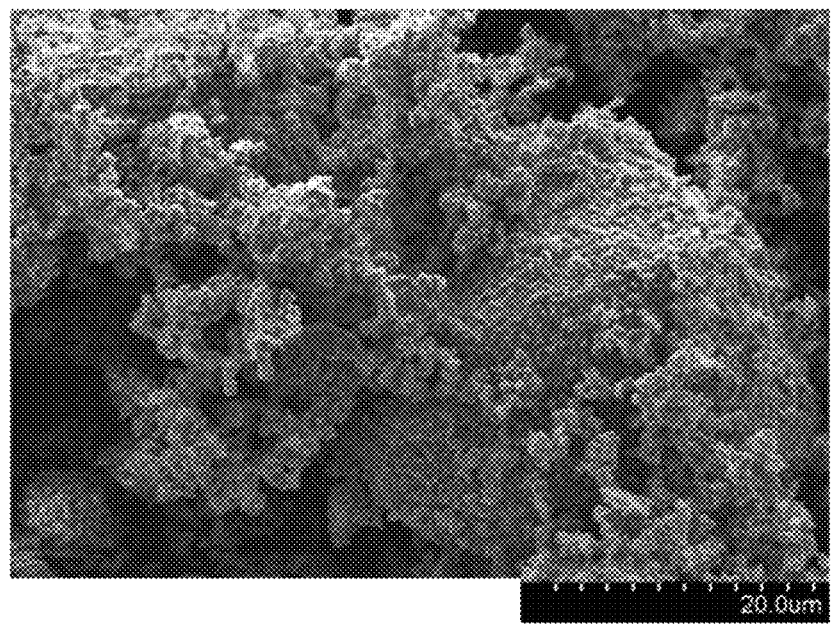
FIG. 6 shows an SEM micrograph of Portland cement modified with iron oxide black via shaking.

A one-gallon paint can was charged with 1,224 g Portland cement (Quikrete) and 576 g iron oxide black (Bayferrox 318). The vessel was sealed and then shaken on a Red Devil single-arm paint shaker for 60 minutes. The sample was a fine free-flowing uniformly dark black powder. Analysis by SEM revealed the presence of small iron oxide particles on the surface of the cement (see FIG. 5 (unmodified cement) versus FIG. 6 (cement modified with iron oxide black)).

This demonstrates that a mixture of inorganic compounds, such as Portland cement, can be modified by functional particles using the processes described here.

Example 5

Modification of Alumina with Carbon Black Via Shaking

Figure 7:
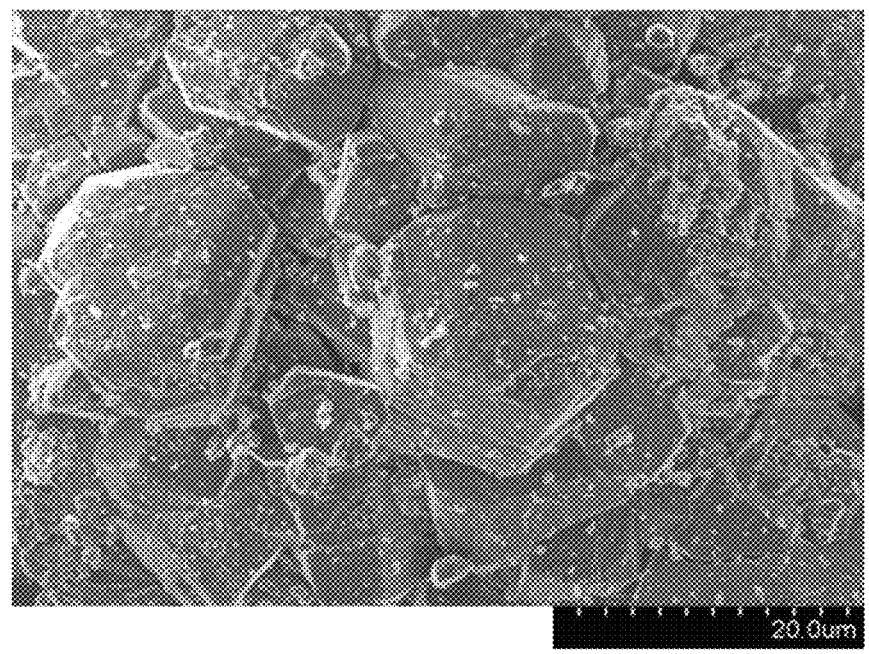
FIG. 7 shows an SEM micrograph of alumina.
Figure 8:
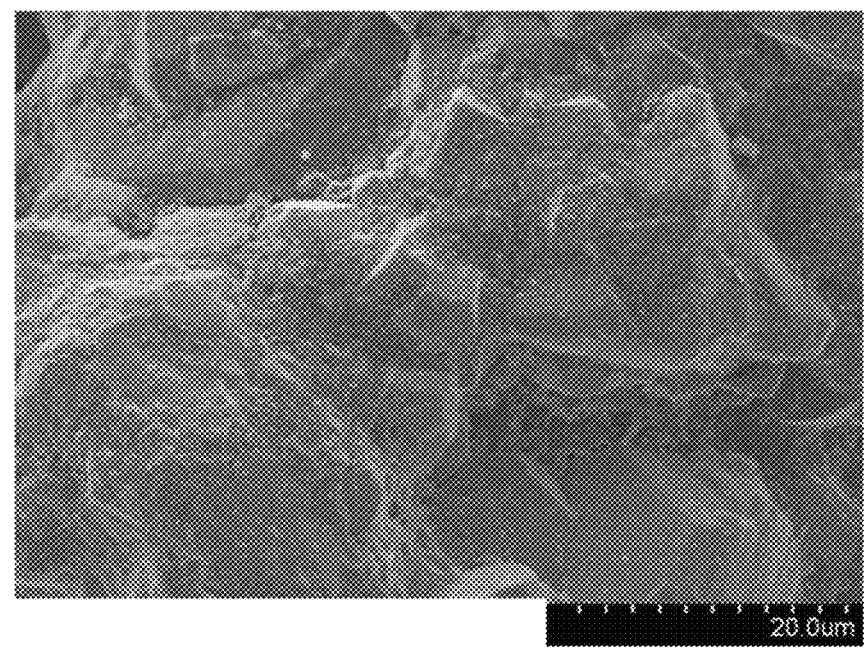
FIG. 8 shows an SEM micrograph of alumina modified with carbon black.

A one-gallon paint can was charged with 1,757.5 g alumina (C-1, 87 micron, Rio Tinto Alcan) and 42.5 g Arosperse F138 carbon black. The vessel was sealed and then shaken on a Red Devil single-arm paint shaker for 60 minutes. The sample was a fine free-flowing uniformly dark black powder. Analysis by SEM revealed the presence of small carbon black particles on the surface of the alumina (see FIG. 7 (unmodified alumina) versus FIG. 8 (alumina modified with carbon black)).

This further demonstrates that a metal oxide filler can be modified by functional particles using the processes described here.

Example 6

Modification of Silicon Carbide with Carbon Black Via Shaking

Figure 9:
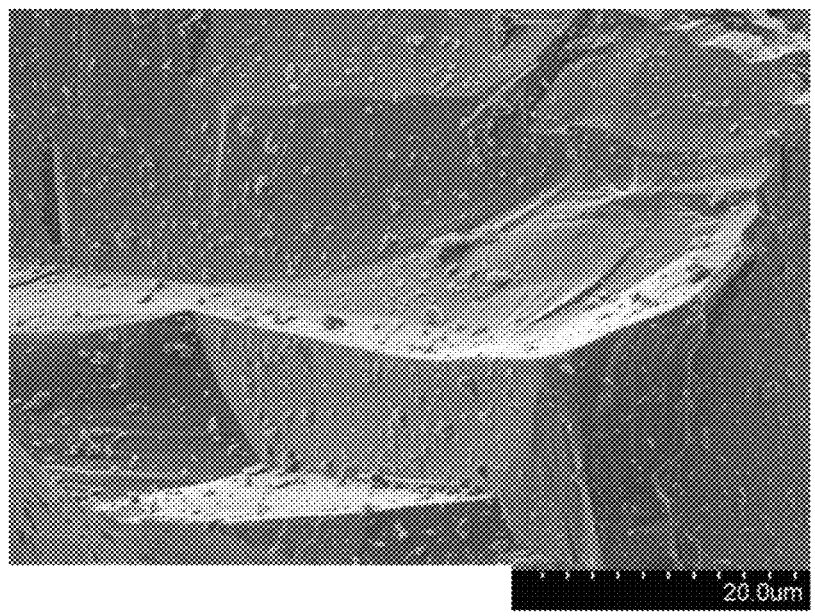
FIG. 9 shows an SEM micrograph of silicon carbide.
Figure 10:
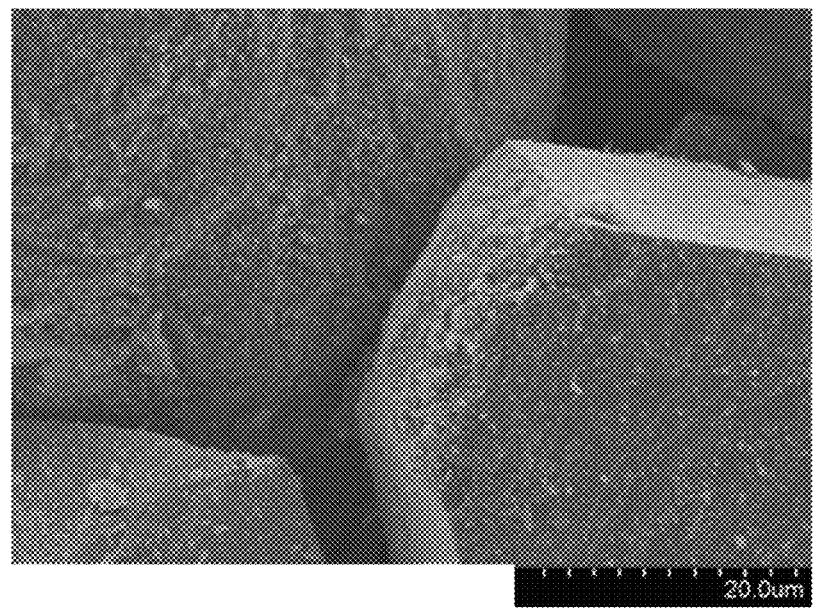
FIG. 10 shows an SEM micrograph of silicon carbide modified with carbon black.

A one-gallon paint can was charged with 1,757.5 g silicon carbide (Black Silicon Carbide Grain, 80 micron, Silicon Carbide Products) and 42.5 g Arosperse F138 carbon black. The vessel was sealed and then shaken on a Red Devil single-arm paint shaker for 60 minutes. The sample was a fine free-flowing uniformly dark black powder. Analysis by SEM revealed the presence of small particles on the surface of the silicon carbide (see FIG. 9 (unmodified silicon carbide) versus FIG. 10 (silicon carbide modified with carbon black)).

This demonstrates that a carbide compound can be modified by functional particles using the processes described here.

Example 7

Modification of ATH with Carbon Black Via Shaking, and Subsequent Processing

Figure 11A:
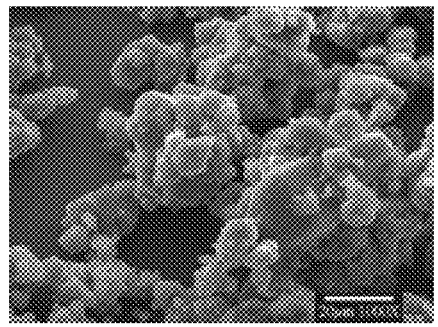
FIG. 11 shows SEM micrographs of ATH filler dry-blended with pigment and calcined ATH.
Figure 11B:
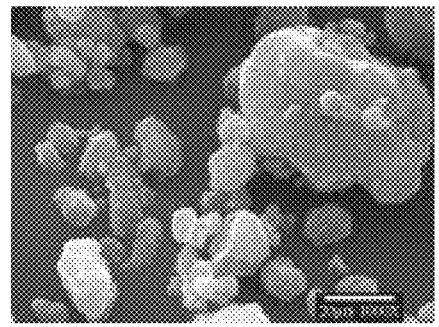
Figure 11C:
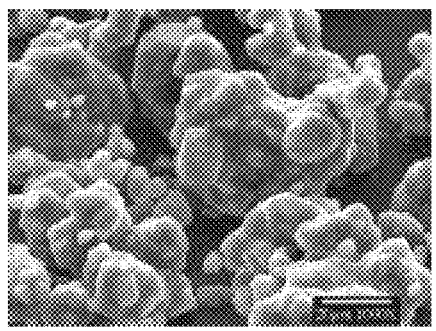

A one-gallon paint can was charged with 1,500 g ATH and 36.3 g Arosperse F138 (carbon black). The vessel was sealed and then shaken on a Red Devil single-arm paint shaker for 30 minutes to create a dry-blended modified filler. A sample of the modified filler was analyzed by SEM (FIG. 11C). The micrograph shows the presence of relatively small carbon black particles evenly distributed on the surface of the relatively large ATH particles.

Figure 11D:
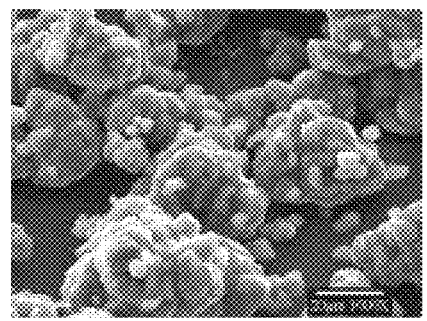
Figure 11E:
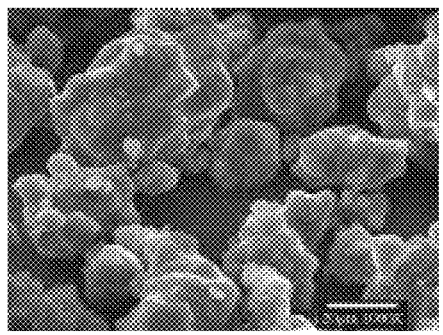
Figure 11F:
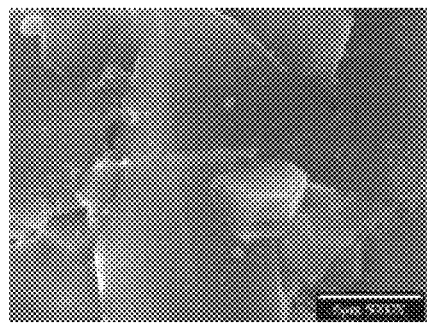
Figure 11G:
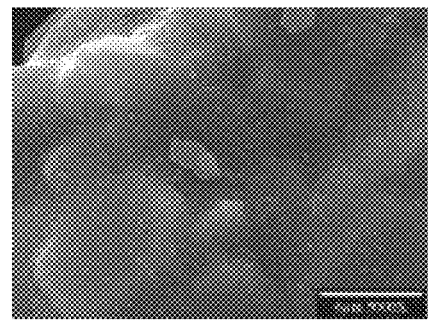

A first test sample was prepared by combining a first 125 g sample of the above mixture with 125 g of unmodified ATH in a one quart vessel and dry-blending them in a Red Devil single-arm paint shaker for 30 minutes to create dry-blended modified filler. A second sample was prepared by combing a second 125 g sample of the above mixture combined with 125 g of calcined ATH in a one quart vessel and dry-blending them in a Red Devil single-arm paint shaker for 30 minutes to create dry-blended modified filler. The calcined ATH had been prepared by heating ATH to 800° C. for 24 hours to remove all three water molecules of hydration. Both samples were analyzed by SEM. The micrograph of the first sample comprised of carbon black-modified ATH dry-blended with an equal weight of unmodified ATH (FIG. 11D) shows an even coating of carbon black particles on all ATH particles, similar to what is shown in FIG. 11C. However, the micrograph of the second sample comprised of carbon black-modified ATH dry-blended with an equal weight of calcined ATH (FIG. 11E) shows a mixture of particles with different surface morphologies, some exhibiting rigidly geometric and sharp edges (FIG. 11F), others exhibiting relatively smooth edges (FIG. 11G). The former are unmodified particles of calcined ATH, the latter being intact modified particles of ATH. This shows that carbon black particles present on the surface of dry-blended ATH can redistribute among unmodified ATH particles when subjected to dry-blending. However, when carbon black-tinted ATH particles are combined with calcined ATH and dry-blended, the carbon black particles remain on the surface of the dry-blended pigment-modified ATH and do not redistribute among the calcined ATH. Thus, the forces involved in typical polymer processing are of insufficient energy to redistribute pigment among fillers with vastly different surface chemistries. The pigment will remain with the filler to which it is modified during dry-blending. This demonstrates that the dry-blended pigment-modified filler will withstand processing forces.

Example 8

Modification of ATH with Quinacridone Red Violet Via Shaking and Formation of a Filled Acrylic Composite Using the Modified Filler A one-gallon paint can was charged with 1,500 g of ATH (Alcan WH-311) and 24.20 g of quinacridone red violet 19 (Lansco Colors). The vessel was sealed and then shaken on a Red Devil single-arm paint shaker for 30 minutes to create a first batch. This procedure was repeated a second time to create a second batch. The first batch and the second batch were combined to form a test batch of dry-blended filler.

An experimental Test Plaque (Test Plaque 8A) was prepared from a liquid prepolymer mixture consisting of 87.0 g methyl methacrylate (MMA), 260.9 g of a 24 wt. % acrylic polymer solution (polymethyl methacrylate of molecular weight approximately 30 kg/mol dissolved in MMA), 4.3 g trimethylolpropane trimethacrylate, 10.0 g tert-butylperoxymaleic acid (PMA-25, Arkema), 0.7 g of Zelec PH unsaturated phosphoric acid ester (Stepan Co.) and 1.5 g AOT-S (Cytec) was blended at room temperature. While stirring at 300 rpm with an air-driven pitch blade turbine, 630.0 g of the dry-blended quinacridone red modified ATH filler described above was added over one minute. Mixing was continued for two additional minutes. The resultant mixture was transferred to an enclosed vessel where dissolved gases were removed in vacuo (24 inHg) over a period of two minutes while stirring at 1,000 rpm. While still under vacuum, 4.2 g of a calcium hydroxide suspension (45 wt. % in solvent) was added via syringe through a rubber septum. This was immediately followed by addition of 1.6 g ethylene glycol dimercaptoacetate (GDMA). After mixing for 30 seconds, the vacuum was released and the mixture was poured into a film-lined casting cavity which was pre-heated to 35° C. Film was placed on the backside of the casting, and an insulated cover was placed on top. The mixture cured within 15 minutes. After allowing the resultant plaque to cool to room temperature, it was rough-finished in a drum sander and then sanded with progressively finer grit sand paper ending with 4000-grit to create Test Plaque 8A.

A control Test Plaque (Test Plaque 8B) of a liquid dispersion pigmented filled polymeric material was prepared from a liquid prepolymer mixture prepared in the same manner as above. While stirring at 300 rpm with an air-driven pitch blade turbine, 620.0 g of unmodified ATH (Alcan WH-311) was added over one minute. Mixing was continued for two additional minutes. Afterwards, 10.0 g of quinacridone red violet 19 (Lansco Color) was added to the stirring mixture over one minute. Mixing was again continued for two additional minutes. The resultant mixture was transferred to an enclosed vessel where dissolved gases were removed in vacuo (24 inHg) over a period of two minutes while stirring at 1,000 rpm. While still under vacuum, 4.2 g of a calcium hydroxide suspension (45 wt. % in solvent) was added via syringe through a rubber septum. This was immediately followed by addition of 1.6 g ethylene glycol dimercaptoacetate (GDMA). After mixing for 30 seconds, the vacuum was released and the mixture was poured into a film-lined casting cavity which was pre-heated to 35° C. Film was placed on the backside of the casting, and an insulated cover was placed on top. The mixture cured within 15 minutes. After allowing the resultant plaque to cool to room temperature, it was rough-finished in a drum sander and then sanded with progressively finer grit sand paper ending with 4000-grit to create Test Plaque 8B.

A Hunter Miniscan spectrophotometer was used to measure the color of both Test Plaques. The L, a, b color space is used to describe the color measurement where the 'L' value is a measure of lightness (low 'L' is dark, high 'L' light), the 'a' value represents the red/green axis (negative 'a' is toward a green hue, positive 'a' is toward a red hue) and the 'b' value represents the yellow/blue axis (negative 'b' is toward a blue hue, positive 'b' is toward a yellow hue). The difference in color between two samples (or a single sample before and after a physical test) can be represented as the change in each color axis: ΔL, Δa, and Δb. Alternatively, the root-mean-square average of the three delta-values can be calculated to give a total color difference, ΔE. As shown in Table 1, there is a significant difference in the color of the composites, despite an equal loading of pigment. In particular, the L value for the composite of Test Plaque 8B is two units higher (lighter) than that of Test Plaque 8A. This represents a difference in tinting strength of the pigment, indicating a poor dispersion of pigment particles in 5B.

TABLE 1

| | L a b color values | | |
|---|---|---|---|
| | L | a | b |
| Test Plaque 8A (dry-blended) | 31.15 | 28.02 | 8.23 |
| Test Plaque 8B (liquid dispersion) | 33.22 | 31.25 | 8.92 |

Example 9

Modification of ATH with Carbon Black Via Shaking and Formation of a Filled Acrylic Composite Using the Modified Filler A one-gallon paint can was charged with 1,500 g ATH (Alcan WH-311) and 36.3 g Arosperse F138 carbon black (Evonik). The vessel was sealed and then shaken on a Red Devil single-arm paint shaker for 30 minutes to create a first batch of modified filler. This procedure was repeated a second time, the resulting batch of modified filler being combined with the first batch to create a total batch of dry-blended filler.

Figure 12:
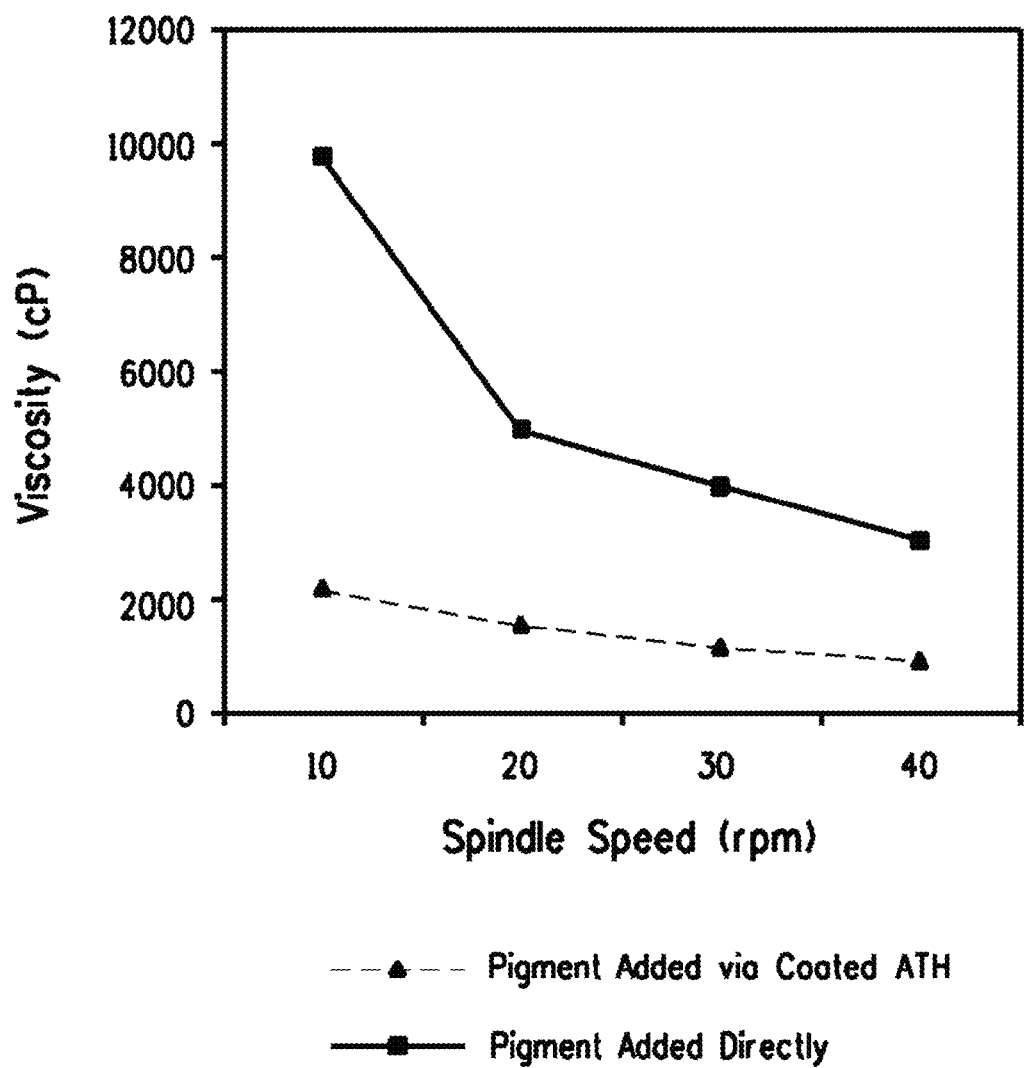
FIG. 12 is a plot of viscosity vs. spindle speed comparing direct pigment addition to dry-blended addition of pigment.

An experimental Test Plaque (Test Plaque 9A) was prepared from a liquid prepolymer mixture consisting of 85.8 g methyl methacrylate (MMA), 257.3 g of a 24 wt. % acrylic polymer solution (polymethyl methacrylate of molecular weight approximately 30 kg/mol dissolved in MMA), 4.2 g trimethylolpropane trimethacrylate, 9.9 g tert-butylperoxymaleic acid (PMA-25, Arkema), 0.7 g of Zelec PH unsaturated phosphoric acid ester (Stepan Co.) and 1.5 g AOT-S (Cytec) was blended at room temperature. While stirring at 300 rpm with an air-driven pitch blade turbine, 635.0 g of the carbon black modified ATH described above was added over one minute. Mixing was continued for two additional minutes. Brookfield viscosity of the mixture was measured at this point (RV-DV-II, S-72 vane spindle, 21-22° C.) and is shown in FIG. 12. The mixture was then transferred to an enclosed vessel where dissolved gases were removed in vacuo (24 inHg) over a period of two minutes while stirring at 1,000 rpm. While still under vacuum, 4.1 g of a calcium hydroxide suspension (45 wt. % in solvent) was added via syringe through a rubber septum. This was immediately followed by addition of 1.6 g ethylene glycol dimercaptoacetate (GDMA). After mixing for 30 seconds, the vacuum was released and the mixture was poured into a film-lined casting cavity which was pre-heated to 35° C. Film was placed on the backside of the casting, and an insulated cover was placed on top. The mixture cured within 15 minutes. After allowing the resultant plaque to cool to room temperature, it was rough-finished in a drum sander and then sanded with progressively finer grit sand paper ending with 240-grit to create Test Plaque 9A, a filled polymeric material pigmented with dry-blended filler.

A control Test Plaque (Test Plaque 9B) was prepared from a liquid prepolymer mixture prepared in the same manner as above. While stirring at 300 rpm with an air-driven pitch blade turbine, 620.0 g of unmodified ATH (Alcan WH-311) was added over one minute. Mixing was continued for two additional minutes. Afterwards, 15.0 g of Arosperse F138 was added to the stirring mixture over one minute. Mixing was again continued for two additional minutes. Brookfield viscosity of the mixture was measured at this point (RV-DV-II, S-72 vane spindle, 21-22° C.) and is shown in FIG. 12. The mixture was then transferred to an enclosed vessel where dissolved gases were removed in vacuo (24 inHg) over a period of two minutes while stirring at 1,000 rpm. While still under vacuum, 4.1 g of a calcium hydroxide suspension (45 wt. % in solvent) was added via syringe through a rubber septum. This was immediately followed by addition of 1.6 g ethylene glycol dimercaptoacetate (GDMA). After mixing for 30 seconds, the vacuum was released and the mixture was poured into a film-lined casting cavity which was pre-heated to 35° C. Film was placed on the backside of the casting, and an insulated cover was placed on top. The mixture cured within 15 minutes. After allowing the resultant plaque to cool to room temperature, it was rough-finished in a drum sander and then sanded with progressively finer grit sand paper ending with 240-grit to create Test Plaque 9B, a filled polymeric material with pigment added directly to the liquid prepolymer mixture.

A plot of the viscosity of the liquid prepolymer mixture vs. the spindle speed of the air-driven pitch blade turbine is given in FIG. 12 for both of the Test Plaques. The mixture of Test Plaque 9B (where carbon black was added directly to the batch) exhibits a higher viscosity at all spindle speeds and, further, exhibits significant shear thinning behavior than that of Test Plaque 9A.

Test Plaque 9A was of high visual quality, exhibiting a uniform black appearance. Test Plaque 9B was of poor visual quality, exhibiting dark spots visible on all surfaces of the plaque. The dark spots were determined to be agglomerated pigment under visual inspection.

A Hunter Miniscan spectrophotometer was used to measure the color of both Test Plaques. As shown in Table 2, there is a significant difference in L color of the composites, despite an equal loading of pigment. The L value of Test Plaque 9B is 1.13 units lighter than that of Test Plaque 9A, again indicating that adding the pigment directly to the ATH-containing mixture results in poor dispersion of the pigment and, thus, low tinting strength.

TABLE 2

L a b Color Values

|  | L | a | b |
|---|---|---|---|
| Composite of Test Plaque 9A | 24.90 | −0.25 | −1.63 |
| Composite of Test Plaque 9B | 26.03 | −0.37 | −2.00 |

This demonstrates that dry-blending provides a means for introducing a functional particle (such as a pigment) into a liquid prepolymer mixture in a manner that achieves enhanced color characteristics when compared to traditional direct addition to the liquid prepolymer mixture.

It also demonstrates that the addition of pigment directly into the liquid prepolymer results in agglomerate formation and a reduction in the tinting strength of the pigment as compared to the addition of pigment to a filled prepolymer mixture by first bonding the pigment to filler by dry-blending them before combining with the liquid prepolymer.

It also demonstrates that the addition of pigment to a filled prepolymer mixture by first bonding the pigment to filler by dry-blending them before combining with the liquid prepolymer results in a significant decrease in the viscosity of the mixture. Decreased viscosity of the prepolymer is beneficial to manufacturing processes that are required in order to form objects from the prepolymer.

Example 10

Modification of ATH with Carbon Black Using a Commercial Scale Horizontal Plough Mixer with Chopper and Formation of a Filled Acrylic Composite Using the Modified Filler A 130-L Littleford Day horizontal plough mixer (model FM-130), equipped with an 4-blade inverted Christmas tree chopper (4 inch, 6 inch, 7 inch, 7 inch) was charged with 172.5 lbs of ATH (Alcan WH-311) and 4.13 lbs of Arosperse F-138 carbon black (Evonik). The mixer was run with a plough speed of 155 rpm and a chopper speed of 3,400 rpm. A sample of the mixture was taken after 5 minutes. The sample was a fine free-flowing uniformly dark powder. Analysis by SEM revealed the presence of carbon black on the surface of the ATH, comparable to what is depicted for materials generated using small scale methods, such as shaking.

Figure 13:
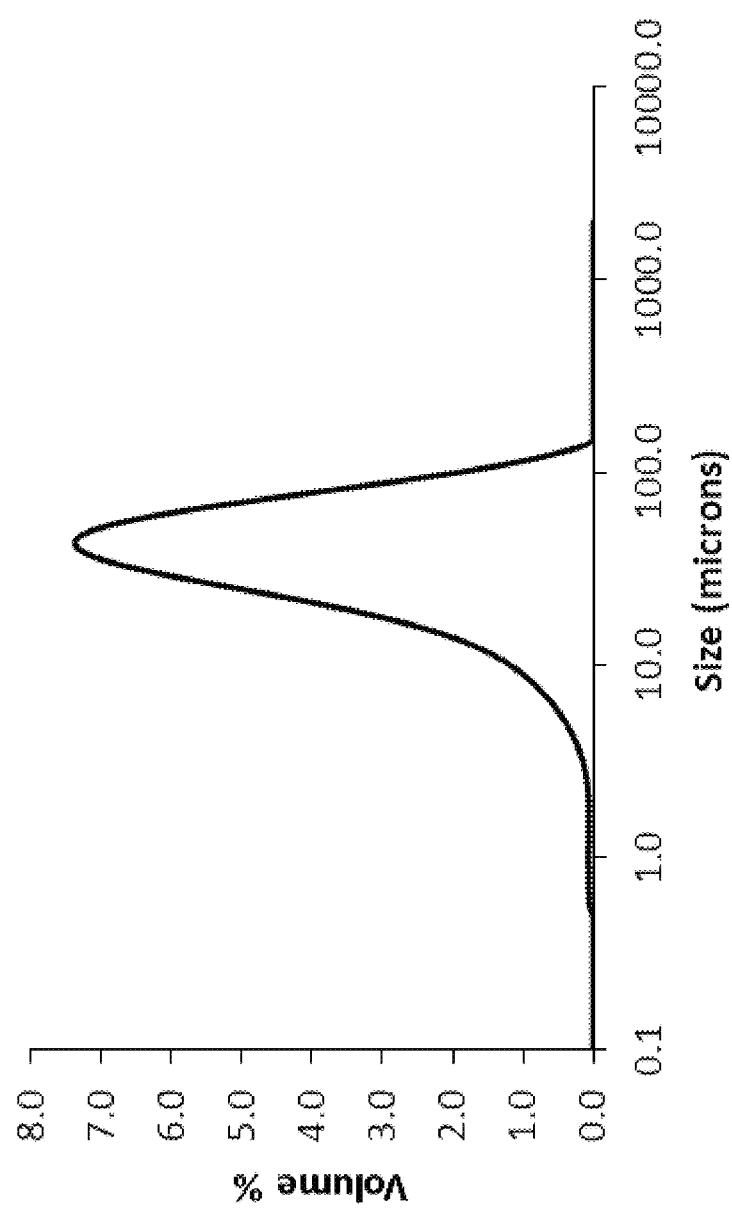
FIG. 13 shows the particle size distribution plot of ATH modified with carbon black made using a horizontal plough mixer.
Figure 14:
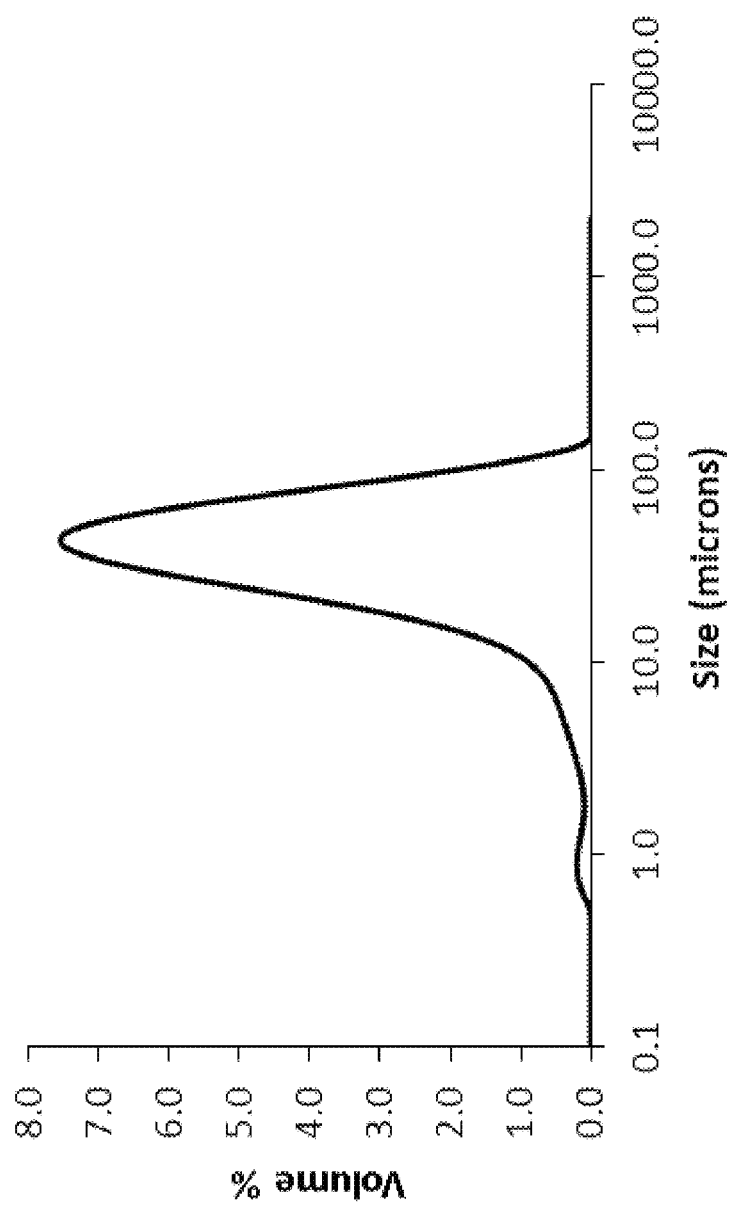
FIG. 14 shows the particle size distribution plot of ATH (Alcan WH-311).
Figure 15:
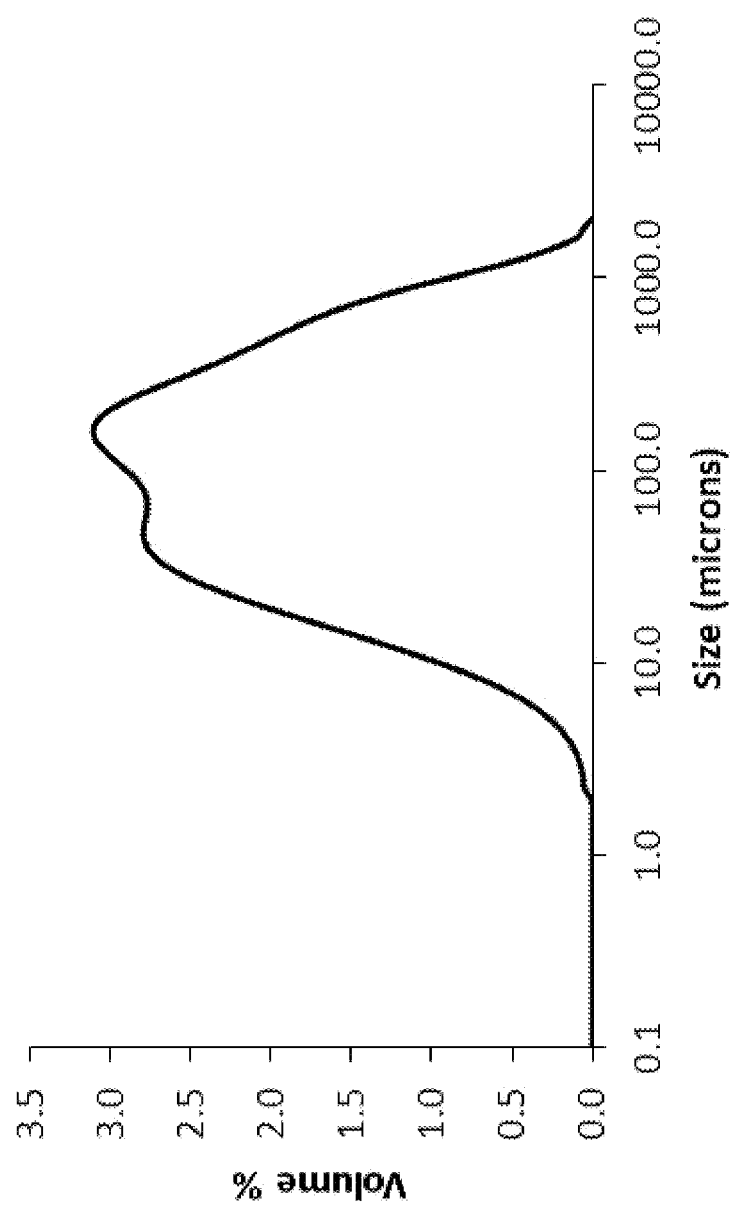
FIG. 15 shows the particle size distribution plot of a 1:1 (by weight) mixture of carbon black and ATH that was gently combined.

The sample was subjected to particle size analysis via light scattering using a Malvern Mastersizer 2000. The sample was measured in water with sodium metaphosphate as dispersant. The particle size distribution (PSD) is shown in FIG. 13. It nearly overlays the PSD of the unmodified ATH which is depicted in FIG. 14. In contrast, a sample made by combining ATH and carbon black (1:1 by weight) and then gently and manually mixing yields a sample with a bimodal and broad PSD (FIG. 15). As expected, a functional particle-modified filler made by the processes described here gives a single unimodal PSD curve while a simple mixture of the same two components gives a broad, bimodal PSD curve.

The sample was used to cast an experimental Test Plaque (Test Plaque 10-A). This was prepared from a liquid prepolymer mixture consisting of 83.4 g methyl methacrylate (MMA), 264.00 g of a 24 wt. % acrylic polymer solution (polymethyl methacrylate of molecular weight approximately 30 kg/mol dissolved in MMA), 4.26 g trimethylolpropane trimethacrylate, 7.10 g tert-butylperoxymaleic acid (PMA-25, Arkema), 0.68 g of Zelec PH unsaturated phosphoric acid ester (Stepan Co.) and 1.50 g AOT-S (Cytec) which were blended at room temperature. While stirring at 300 rpm with an air-driven pitch blade turbine, 635.0 g of the carbon black modified ATH described above was added over one minute. Mixing was continued for two additional minutes. The mixture was then transferred to an enclosed vessel where dissolved gases were removed in vacuo (24 inHg) over a period of two minutes while stirring at 1,000 rpm. While still under vacuum, 2.98 g of a calcium hydroxide suspension (45 wt. % in solvent) was added via syringe through a rubber septum. This was immediately followed by addition of 1.11 g ethylene glycol dimercaptoacetate (GDMA). After mixing for 30 seconds, the vacuum was released and the mixture was poured into a film-lined casting cavity which was pre-heated to 35° C. Film was placed on the backside of the casting, and an insulated cover was placed on top. The mixture cured within 15 minutes. After allowing the resultant plaque to cool to room temperature, it was rough-finished in a drum sander and then sanded with progressively finer grit sand paper ending with 500-grit to create Test Plaque 10-A, a filled polymeric material pigmented with dry-blended filler. The Test Plaque was of high quality, exhibiting uniform coloration and no visual defects.

This demonstrates that a horizontal plough mixer is an effective machine to modify a filler with a functional particle.

Example 11

Modification of ATH with Carbon Black Using a Commercial Scale Vertical High Intensity Mixer A 180-L Littleford Day vertical high intensity mixer (Model W-180) was charged with 200 lbs of ATH (Alcan WH-311) and 4.92 lbs of Arosperse F-138 carbon black (Evonik). The mixer was run with a plough speed of 900 rpm. A sample of the mixture was taken after 5 minutes. The sample was a fine free-flowing uniformly dark powder.

Figure 16:
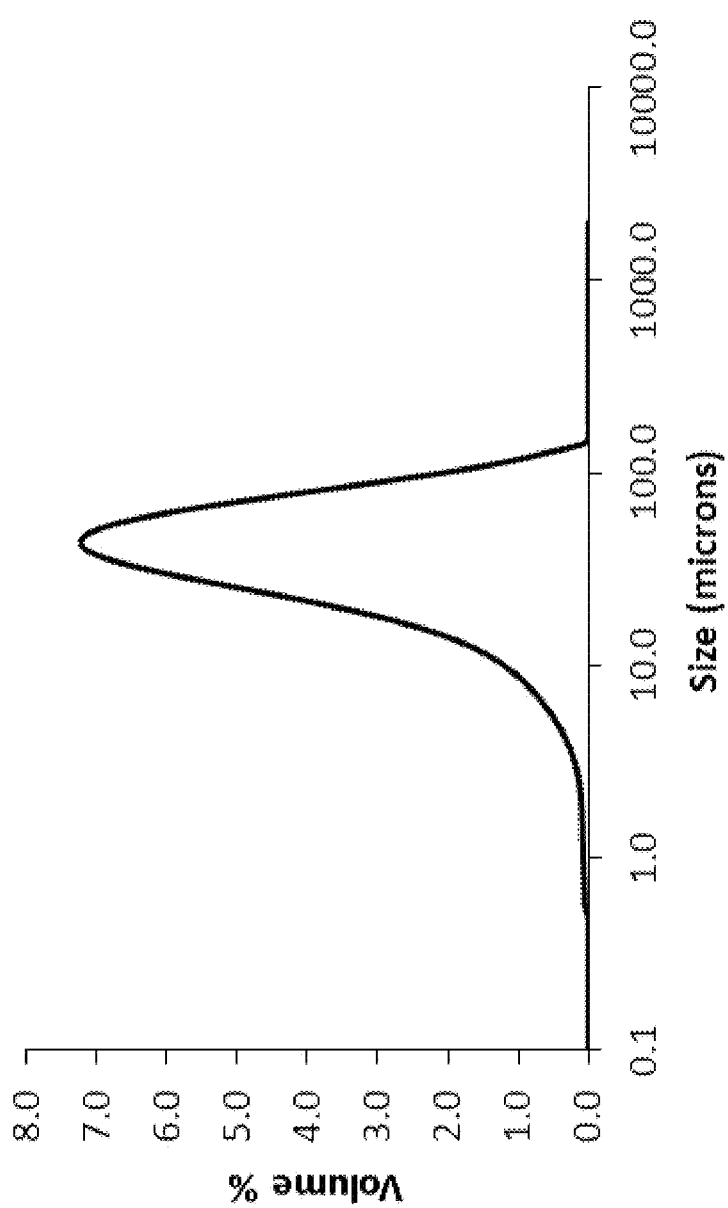
FIG. 16 shows the particle size distribution plot of ATH modified with carbon black made using a vertical high intensity mixer.

The sample was subjected to particle size analysis using the same technique as described in Example 10. The PSD is depicted in FIG. 16. The curve is relatively narrow and unimodal indicating that a single particulate material was generated through modification of the filler (ATH) with a functional particle (carbon black).

The sample was used to cast an experimental Test Plaque (Test Plaque 11-A). The same formulation, casting procedure, and plaque finishing procedure described in Example 10 were used. The Test Plaque was of high quality, exhibiting uniform coloration and no visual defects.

This demonstrates that a vertical high intensity mixer is an effective machine to modify a filler with a functional particle.

Example 12

Modification of ATH with Carbon Black Using an EIRICH Mixer

An EIRICH mixer (RV02E) equipped with a star-type rotor was charged with 52.7 kg of ATH (Alcan WH-311) and 1.3 kg of Arosperse F-138 carbon black (Evonik). The mixer was run with an agitator tip speed of 30 m/s and a pan rotation speed of 37 rpm. A sample of the mixture was taken after 5 minutes. The sample was a fine free-flowing uniformly dark powder.

Figure 17:
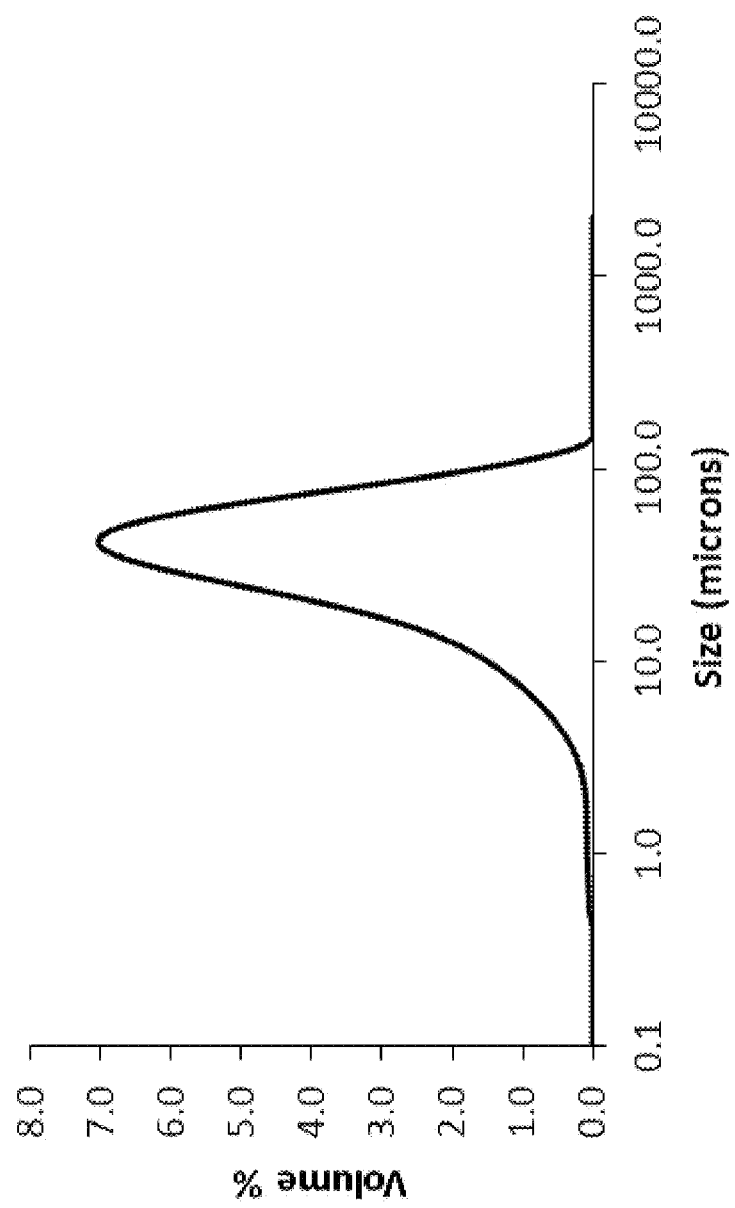
FIG. 17 shows the particle size distribution plot of a carbon black modified ATH made using an EIRICH mixer.

The sample was subjected to particle size analysis using the same technique as described in Example 10. The PSD is depicted in FIG. 17. The curve is relatively narrow and unimodal indicating that a single particulate material was generated through modification of the filler (ATH) with a functional particle (carbon black).

The sample was used to cast an experimental Test Plaque (Test Plaque 12-A). The same formulation, casting procedure, and plaque finishing procedure described in Example 10 were used. The Test Plaque was of high quality, exhibiting uniform coloration and no visual defects.

This demonstrates that an EIRCH-type mixer is an effective machine to modify a filler with a functional particle.

Example 13

Figure 18:
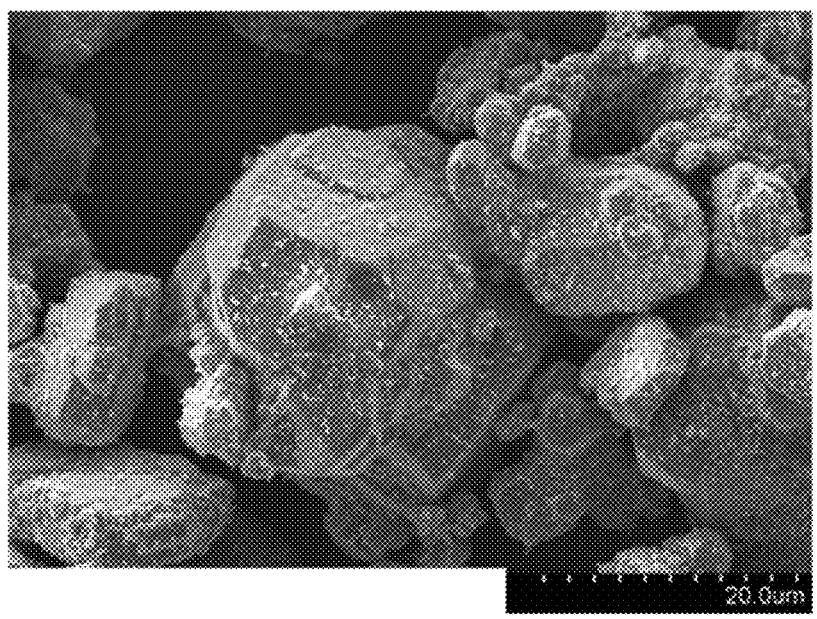
FIG. 18 shows an SEM micrograph of ATH simultaneously modified with carbon black, iron oxide red, and iron oxide yellow via shaking.

Modification of ATH with Carbon Black, Iron Oxide Red, and Iron Oxide Yellow Simultaneously Via Shaking and Formation of a Filled Acrylic Composite Using the Modified Filler A one-gallon paint can was charged with 1,758.42 g ATH (Alcan WH-311) and 9.54 g Arosperse F138 carbon black (Evonik), 16.02 g iron oxide red (Rockwood, Kroma Red, R03097) and 16.02 g iron oxide yellow (Rockwood, Ultra Yellow, YL01888D). The vessel was sealed and then shaken on a Red Devil single-arm paint shaker for 60 minutes. The sample was a fine free-flowing uniformly dark brown powder. Analysis by SEM revealed the presence of a multitude of particles on the surface of the ATH (see FIG. 1A (unmodified ATH) versus FIG. 18 (ATH modified with carbon black, iron oxide red, and iron oxide yellow)).

An experimental Test Plaque (Test Plaque 13-A) was prepared from a liquid prepolymer mixture consisting of 83.4 g methyl methacrylate (MMA), 264.00 g of a 24 wt. % acrylic polymer solution (polymethyl methacrylate of molecular weight approximately 30 kg/mol dissolved in MMA), 4.26 g trimethylolpropane trimethacrylate, 7.10 g tert-butylperoxymaleic acid (PMA-25, Arkema), 0.68 g of Zelec PH unsaturated phosphoric acid ester (Stepan Co.) and 1.50 g AOT-S (Cytec) which were blended at room temperature. While stirring at 300 rpm with an air-driven pitch blade turbine, 635.0 g of the modified ATH described above was added over one minute. Mixing was continued for two additional minutes. The mixture was then transferred to an enclosed vessel where dissolved gases were removed in vacuo (24 inHg) over a period of two minutes while stirring at 1,000 rpm. While still under vacuum, 2.98 g of a calcium hydroxide suspension (45 wt. % in solvent) was added via syringe through a rubber septum. This was immediately followed by addition of 1.11 g ethylene glycol dimercaptoacetate (GDMA). After mixing for 30 seconds, the vacuum was released and the mixture was poured into a film-lined casting cavity which was pre-heated to 35° C. Film was placed on the backside of the casting, and an insulated cover was placed on top. The mixture cured within 15 minutes. After allowing the resultant plaque to cool to room temperature, it was rough-finished in a drum sander and then sanded with progressively finer grit sand paper ending with 500-grit to create Test Plaque 13-A, a filled polymeric material pigmented with dry-blended filler. The Test Plaque was of high quality, exhibiting uniform coloration and no visual defects.

This demonstrates that a filler can be modified with multiple functional particles in one step using the processes described herein.

Example 14

Figure 19:
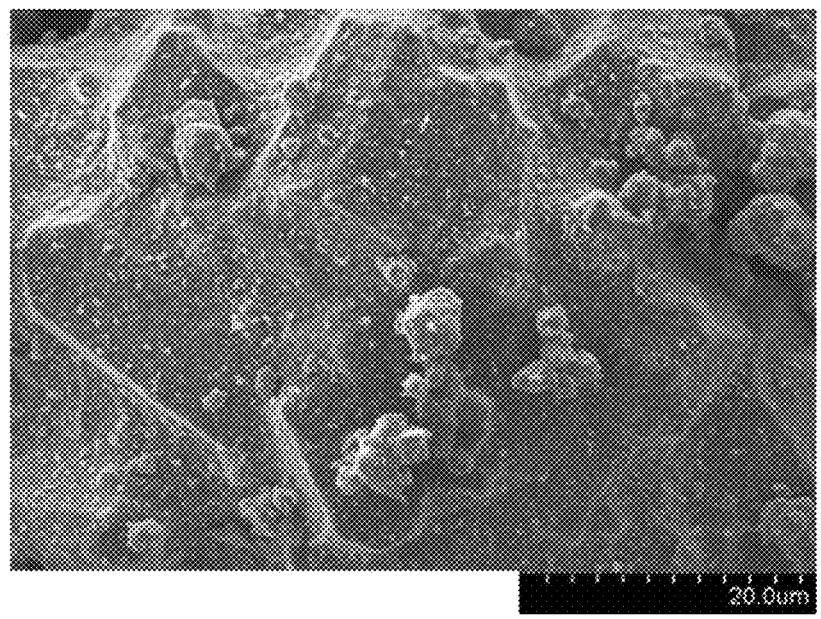
FIG. 19 shows an SEM micrograph of ATH modified with Graphtol Fire Red pigment.

Modification of ATH with an Azo/Strontium Salt Pigment Via Shaking and Formation of a Filled Acrylic Composite Using the Modified Filler A one-gallon paint can was charged with 1,746.00 g ATH (Alcan WH-311) and 54.00 g Graphtol Fire Red 3RLP (Clariant). The vessel was sealed and then shaken on a Red Devil single-arm paint shaker for 60 minutes. The sample was a fine free-flowing uniformly bright red/orange powder. Analysis by SEM revealed the presence of small pigment particles on the surface of the ATH (see FIG. 1A (unmodified ATH) versus FIG. 19 (ATH modified with Graphtol Fire Red)).

The sample was used to cast an experimental Test Plaque (Test Plaque 14-A). The same formulation, casting procedure, and plaque finishing procedure as described in Example 13 were used, except for a substitution with the modified ATH prepared in this example. The Test Plaque was of high quality, exhibiting uniform coloration and no visual defects.

This demonstrates that a filler can be modified with a pigment described as a metal salt of an azo compound, using the processes described herein.

Example 15

Figure 20:
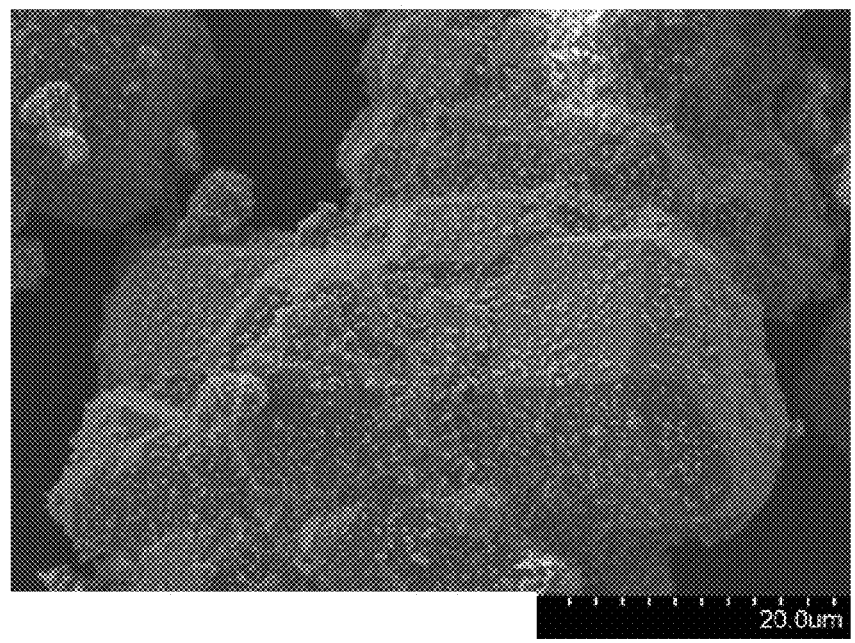
FIG. 20 shows an SEM micrograph of ATH modified with titanium dioxide.

Modification of ATH with Titanium Dioxide Via Shaking and Formation of a Filled Acrylic Composite Using the Modified Filler A one-gallon paint can was charged with 1,746.00 g ATH (Alcan WH-311) and 54.00 g Titanium Dioxide (TiPure R960, DuPont). The vessel was sealed and then shaken on a Red Devil single-arm paint shaker for 60 minutes. The sample was a fine free-flowing uniformly white powder. Analysis by SEM revealed the presence of small titanium dioxide particles on the surface of the ATH (see FIG. 1A (unmodified ATH) versus FIG. 20 (ATH modified with titanium dioxide)).

The sample was used to cast an experimental Test Plaque (Test Plaque 15-A). The same formulation, casting procedure, and plaque finishing procedure as described in Example 13 were used, except for a substitution with the modified ATH prepared in this example. The Test Plaque was of high quality, exhibiting uniform coloration and no visual defects.

This demonstrates that a filler can be modified with titanium dioxide using the processes described herein.

Example 16

Figure 21:
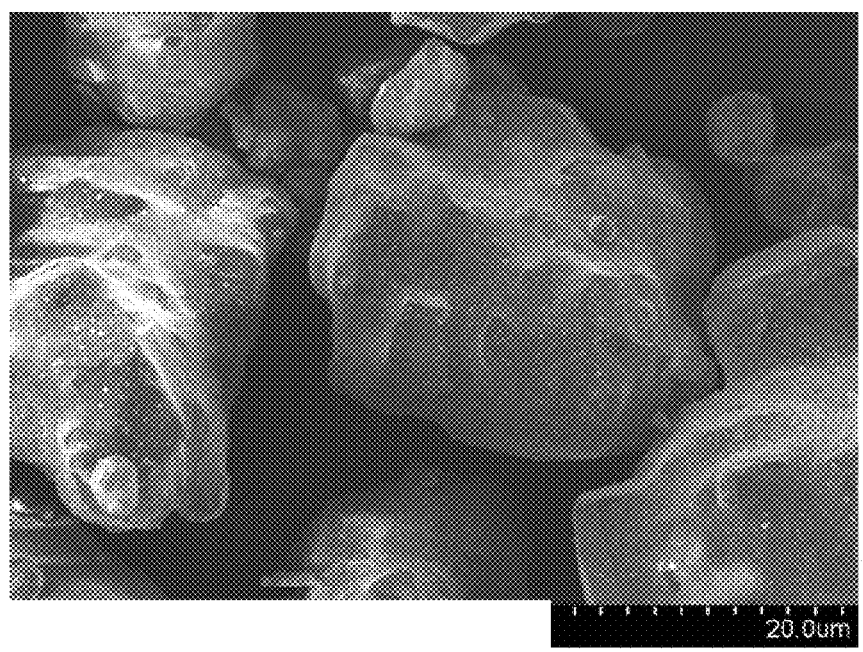
FIG. 21 shows an SEM micrograph of ATH modified with 0.2-0.3 micron fumed silica.

Modification of ATH with Fumed Silica (0.2-0.3 Micron) Via Shaking and Formation of a Filled Acrylic Composite Using the Modified Filler A one-gallon paint can was charged with 1,757.5 g ATH (Alcan WH-311) and 42.5 g fumed silica, (0.2-0.3 microns, Aldrich). The vessel was sealed and then shaken on a Red Devil single-arm paint shaker for 60 minutes. The sample was a fine free-flowing uniformly white powder. Analysis by SEM revealed the presence of small silica particles on the surface of the ATH (see FIG. 1A (unmodified ATH) versus FIG. 21 (ATH modified with 0.2-0.3 micron fumed silica)).

The sample was used to cast an experimental Test Plaque (Test Plaque 16-A). The same formulation, casting procedure, and plaque finishing procedure as described in Example 13 were used, except for a substitution with the modified ATH prepared in this example. The Test Plaque was of high quality, exhibiting uniform coloration and no visual defects.

This demonstrates that a filler can be modified with an amorphous silica particle compound using the processes described herein.

Example 17

Figure 22:
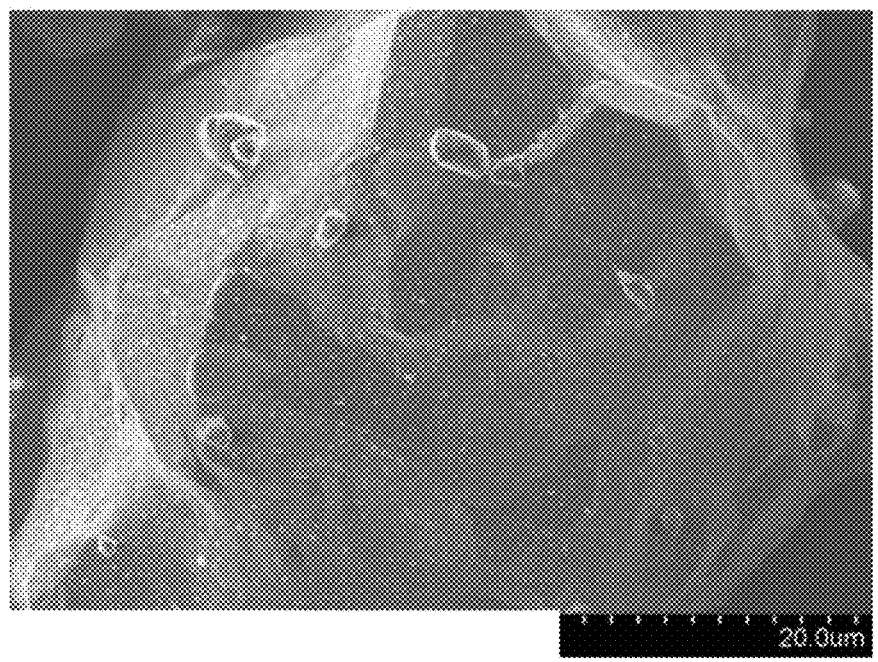
FIG. 22 shows an SEM micrograph of ATH modified with 0.007 micron fumed silica.
Figure 23A:
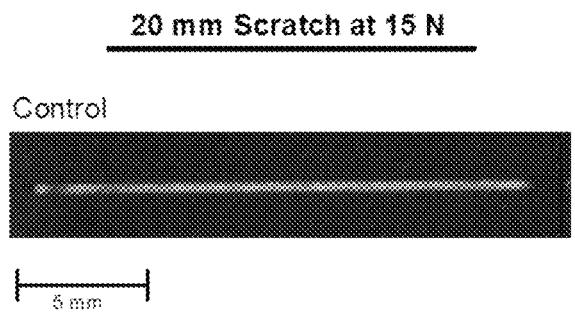
FIG. 23 illustrates scratches on various filled polymer materials and histograms of scans of the scratches.
Figure 23B:
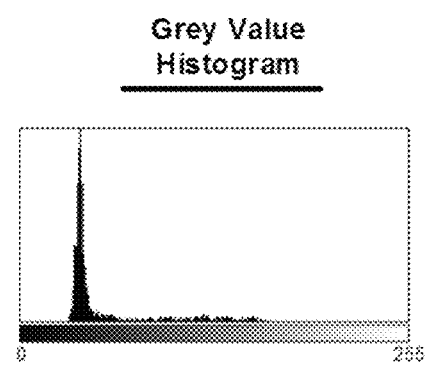
Figure 23C:
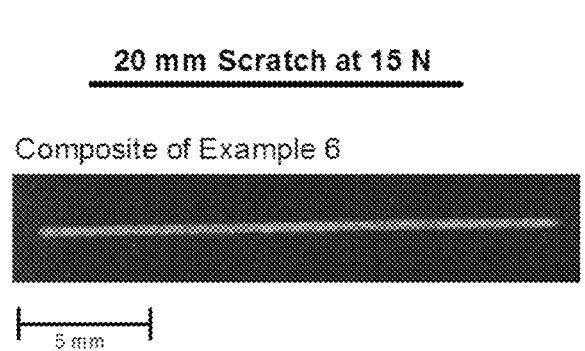
Figure 23D:
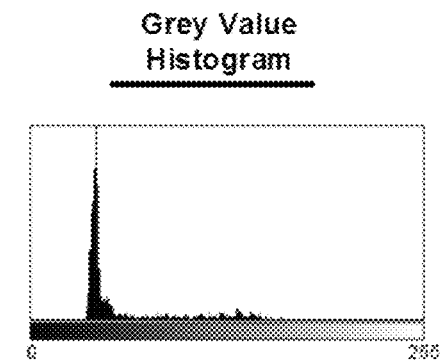
Figures 23E, 23F:
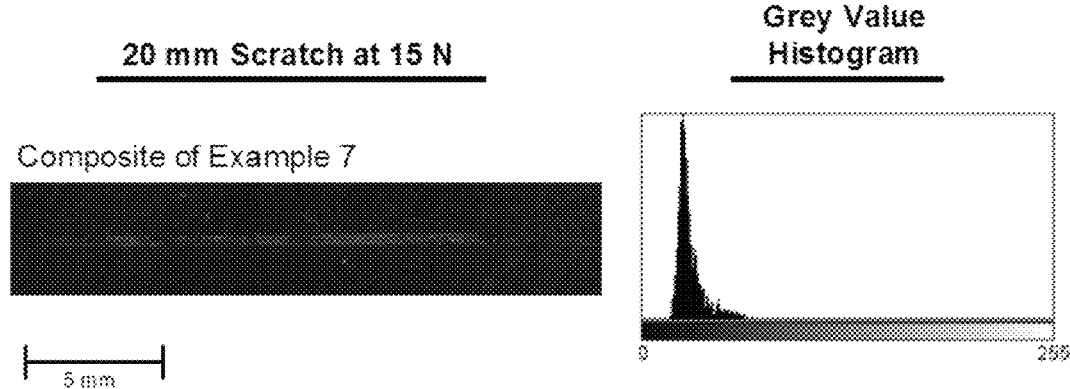

Modification of ATH with Fumed Silica (0.007 Micron) Via Shaking and Formation of a Filled Acrylic Composite Using the Modified Filler The procedures for filler modification and formation of a filled acrylic composite described in Example 16 were repeated exactly, except fumed silica of particle size 0.007 microns (Aldrich) was used as the functional particle. Analysis by SEM again revealed the presence of small silica particles on the surface of the ATH (see FIG. 1A (unmodified ATH) versus FIG. 22 (ATH modified with 0.007 micron fumed silica)).

Example 18

Modification of ATH with Talc Via Shaking and Formation of a Filled Acrylic Composite Using the Modified Filler A one-gallon paint can was charged with 1,757.5 g ATH (Alcan WH-311) and 42.5 g talc, ($D_{50}$=10 microns measured by light scattering, ReactAmine Technology). The vessel was sealed and then shaken on a Red Devil single-arm paint shaker for 60 minutes. The sample was a fine free-flowing uniformly white powder.

The sample was used to cast an experimental Test Plaque (Test Plaque 18-A). The same formulation, casting procedure, and plaque finishing procedure as described in Example 13 were used, except for a substitution with the modified ATH prepared in this example. The Test Plaque was of high quality, exhibiting uniform coloration and no visual defects.

This demonstrates that a filler can be modified with functional platet-type particles using the processes described herein.

Example 19

Modification of ATH with Tinuvin 328 Via Shaking and Formation of a Filled Acrylic Composite Using the Modified Filler A one-gallon paint can was charged with 1,757.5 g ATH (Alcan WH-311) and 42.5 g Tinuvin 328 (BASF). The vessel was sealed and then shaken on a Red Devil single-arm paint shaker for 60 minutes. The sample was a fine free-flowing uniformly white powder.

The sample was used to cast an experimental Test Plaque (Test Plaque 19-A). The same formulation, casting procedure, and plaque finishing procedure as described in Example 13 were used, except for a substitution with the ATH prepared in this example. The Test Plaque was of high quality, exhibiting uniform coloration and no visual defects.

This demonstrates that a filler can be modified with a crystalline small organic molecule using the processes described herein.

Example 20

Modification of ATH with FEP Powder Via Shaking and Formation of a Filled Acrylic Composite Using the Modified Filler A one-gallon paint can was charged with 1,757.5 g ATH (Alcan WH-311) and 42.5 g fluorinated ethylene-propylene copolymer powder (FEP, DuPont). The vessel was sealed and then shaken on a Red Devil single-arm paint shaker for 60 minutes. The sample was a fine free-flowing uniformly white powder.

The sample was used to cast an experimental Test Plaque (Test Plaque 20-A). The same formulation, casting procedure, and plaque finishing procedure as described in Example 13 were used, except for a substitution with the modified ATH prepared in this example. The Test Plaque was of high quality, exhibiting uniform coloration and no visual defects.

This demonstrates that a filler can be modified with semicrystalline polymeric particles using the processes described herein.

Example 21

Modification of ATH with PFA Powder Via Shaking and Formation of a Filled Acrylic Composite Using the Modified Filler A one-gallon paint can was charged with 1,757.5 g ATH (Alcan WH-311) and 42.5 g perfluoroalkoxy polymer powder (PFA, DuPont). The vessel was sealed and then shaken on a Red Devil single-arm paint shaker for 60 minutes. The sample was a fine free-flowing uniformly white powder.

The sample was used to cast an experimental Test Plaque (Test Plaque 21-A). The same formulation, casting procedure, and plaque finishing procedure as described in Example 13 were used, except for a substitution with the modified ATH prepared in this example. The Test Plaque was of high quality, exhibiting uniform coloration and no visual defects.

This again demonstrates that a filler can be modified with semicrystalline polymeric particles using the processes described herein.

Comparative Example 1

A control sample was prepared for comparative analysis against the experimental samples prepared for Examples 22 and 23, described below. The control sample is a commercially sold ATH-filled acrylic solid surface material (Corian®, available from DuPont) composite sheet that is a highly saturated black color. The material is pigmented with carbon black at a level of 0.058 wt %. The carbon black was introduced to a liquid prepolymer mixture via a dispersion of general composition known to those skilled in the art. The control sample was sanded identically to the experimental samples, as described below in Example 22. After measuring the color values of the control sample (Table 7) it was sawn into ten Test Plaques, Comparative Test Plaques 1A, 1B, 1C, 1D, 1E, 1F, 1G, 1H, 1I, and 1J. The control sample provides a comparison of filled polymeric materials that are pigmented by traditional liquid dispersions against filled polymeric materials that are pigmented by dry-blending the pigment and filler prior to incorporation into a liquid prepolymer mixture, and also to filler that is dyed before incorporation into a liquid prepolymer mixture.

Example 22

Pilot Scale Casting of Filled Acrylic Composition Comprising ATH Modified with Carbon Black at 0.094 wt. %

A batch of ATH modified with Arosperse F138 carbon black at a low level (0.094 wt. %) was made by dry-blending via shaking as described in Example 3 to make dry-blended carbon black modified ATH.

A liquid prepolymer mixture consisting of 2.5 kg methyl methacrylate (MMA), 10.1 kg of a 24 wt. % acrylic polymer solution (polymethyl methacrylate of molecular weight approximately 30 kg/mol dissolved in MMA), 152.8 g trimethylolpropane trimethacrylate, 280.2 g tert-butylperoxymaleic acid (PMA-25, Arkema), 23.8 g of Zelec PH unsaturated phosphoric acid ester (Stepan Co.) and 52.5 g AOT-S (Cytec) was blended at room temperature in a lined, 10-gallon steel vessel using a combination marine prop/pitch blade turbine impeller. While stirring at 300 rpm, 21.7 kg of the dry-blended carbon black modified ATH described above was added over one minute. Blending was continued for two additional minutes. The mixture was then transferred to an enclosed vessel where dissolved gases were removed in vacuo (24 inHg) over a period of two minutes while stirring at 500 rpm. While still under vacuum, 117.7 g of a calcium hydroxide suspension (45 wt. % in solvent) was added via syringe through a rubber septum. This was immediately followed by addition of 44.0 g of ethylene glycol dimercaptoacetate (GDMA). After mixing for 30 seconds, the vacuum was released and the liquid prepolymer mixture was poured into a film-lined casting cavity. Film was placed on the backside of the casting, and an insulated cover was placed on top. The mixture cured within 15 minutes. After allowing the resultant sheet to cool to room temperature, it was rough-finished in a drum sander and then sanded with a sequence of progressively finer grit sand paper ending with 240-grit to create a low level dry-blended experimental sample. The experimental sample with a low level of pigment dry-blended onto filler was of high visual quality, exhibiting uniform color throughout the specimen, with no blemishes or other defects.

Color measurements were made of the low level experimental sample using a Hunter Miniscan spectrophotometer (Table 3). The color of the control sample, which had carbon black introduced via a standard liquid dispersion, and that of the low level experimental sample made using dry-blended carbon black modified ATH were approximately the same.

TABLE 3

Initial Color Values

|  | L | a | b |
|---|---|---|---|
| Control Sample | 27.07 | −0.53 | −2.48 |
| Low Level Experimental Sample | 26.91 | −0.61 | −2.68 |

The low level experimental sample was then sawn into three pieces to create Test Plaques 22A, 22B, and 22C.

Test Plaque 22A and Comparative Test Plaque 1A were subjected to water blush testing by immersion in 72° C. water for 16 hours. Color measurements were made on each sample before and after the test and ΔE values were calculated (Table 4). The data shows that Comparative Test Plaque 1A had significantly more whitening due to water blush than was observed for Test Plaque 22A. This demonstrates that dry-blended filler provides colored filled polymer materials having improved resistance to whitening due to water blush.

TABLE 4

Calculated Color Change After Water Blush Testing.

|  | ΔE |
|---|---|
| Comparative Test Plaque 1A | 5.75 |
| Test Plaque 22A | 1.18 |

Comparative Test Plaque 1B and Test Plaque 22B were subjected to a thermobending test. Both samples were heated to 160° C. in a double platen oven. Afterwards, they were placed over a curved form with a 3 inch radius. The specimens were allowed to cool completely in a vacuum press. The color of the center region of each sample was read before and after the test. The results provided in Table 5 below show a significantly lower color change for Test Plaque 22B compared to Comparative Test Plaque 1B. This demonstrates that dry-blended filler provides colored filled polymer materials having improved resistance to whitening due to thermobending.

TABLE 5

Calculated Color Change After Thermobending

|  | ΔE |
|---|---|
| Comparative Test Plaque 1B | 2.70 |
| Test Plaque 22B | 0.64 |

Example 23

Pilot Scale Casting of Filled Acrylic Composition Comprising ATH Dry-blended with Carbon Black at 2.36 wt. %

A batch of ATH modified by with Arosperse F138 carbon black at a high level (2.36 wt. %) was made by dry-blending via shaking as described in Example 3, to make dry-blended carbon black modified ATH.

A liquid premix consisting of 2.4 kg methyl methacrylate (MMA), 9.7 kg of a 24 wt. % acrylic polymer solution (polymethyl methacrylate of molecular weight approximately 30 kg/mol dissolved in MMA), 147.0 g trimethylolpropane trimethacrylate, 269.5 g tert-butylperoxymaleic acid (PMA-25, Arkema), 23.8 g of Zelec PH unsaturated phosphoric acid ester (Stepan Co.) and 52.5 g AOT-S (Cytec) was blended at room temperature in a lined, 10-gallon steel vessel using a combination marine prop/pitch blade turbine impeller. While stirring at 300 rpm, 22.2 kg of the carbon black modified ATH described above was added over one minute. Mixing was continued for two additional minutes. The mixture was then transferred to an enclosed vessel where dissolved gases were removed in vacuo (24 inHg) over a period of two minutes while stirring at 500 rpm. While still under vacuum, 113.2 g of a calcium hydroxide suspension (45 wt. % in solvent) was added via syringe through a rubber septum. This was immediately followed by addition of 42.3 g ethylene glycol dimercaptoacetate (GDMA). After mixing for 30 seconds, the vacuum was released and the mixture was poured into a film-lined casting cavity. Film was placed on the backside of the casting, and an insulated cover was placed on top. The mixture cured within 15 minutes. After allowing the resultant sheet to cool to room temperature, it was rough-finished in a drum sander and then sanded with progressively finer grit sand paper ending with 240-grit to create a high level experimental sample. The experimental sample with a high level of pigment dry-blended onto filler was of high visually quality, exhibiting uniform color throughout the specimen, with no blemishes or other defects.

Color measurements were made using a Hunter Miniscan spectrophotometer (Table 6). The color of the high level experimental sample was significantly darker than that of the control sample that was made in Comparative Example 1.

TABLE 6

Initial Color Values

|  | L | a | b |
|---|---|---|---|
| Control Sample | 27.07 | −0.53 | −2.48 |
| High Level Experimental Sample | 23.81 | −0.39 | −1.45 |

After measuring the color values of the high level experimental sample it was sawn into five pieces to create Test Plaques 23A, 23B, 23C, 23D and 23E.

Test Plaque 23A and Comparative Test Plaque 1C were subjected to a water blush test by immersion in 72° C. water for 16 hours. Color measurements were made after the test and ΔE values were calculated compared to the initial values (Table 7). A significant decrease in whitening due to water blush was observed for Test Plaque 23A as compared to the control of Comparative Test Plaque 1C. This demonstrates an improvement in water blush whitening for dry-blended pigment modified filler than for pigments incorporated by traditional liquid dispersions.

TABLE 7

Calculated Color Change After Water Blush Testing.

|  | ΔE |
|---|---|
| Comparative Test Plaque 1C | 5.75 |
| Test Plaque 23A | 0.52 |

Test Plaque 23B and Comparative Test Plaque 1D were subjected to a thermobending test. Both Test Plaques were heated to 160° C. in a double platen oven. Afterwards, the Test Plaques were placed over a curved form with a 3 inch radius. The specimens were allowed to cool completely in a vacuum press. The color of the center region of each Test Plaque was read after the test and compared to the initial value as shown in Table 6. The results provided in Table 8 below show a significantly lower color change for the Test Plaque 23B as compared to the control sample of Comparative Test Plaque 1D.

TABLE 8

Calculated Color Change After Thermobending

|  | ΔE |
|---|---|
| Comparative Test Plaque 1D | 2.70 |
| Test Plaque 23B | 0.20 |

Figure 24:
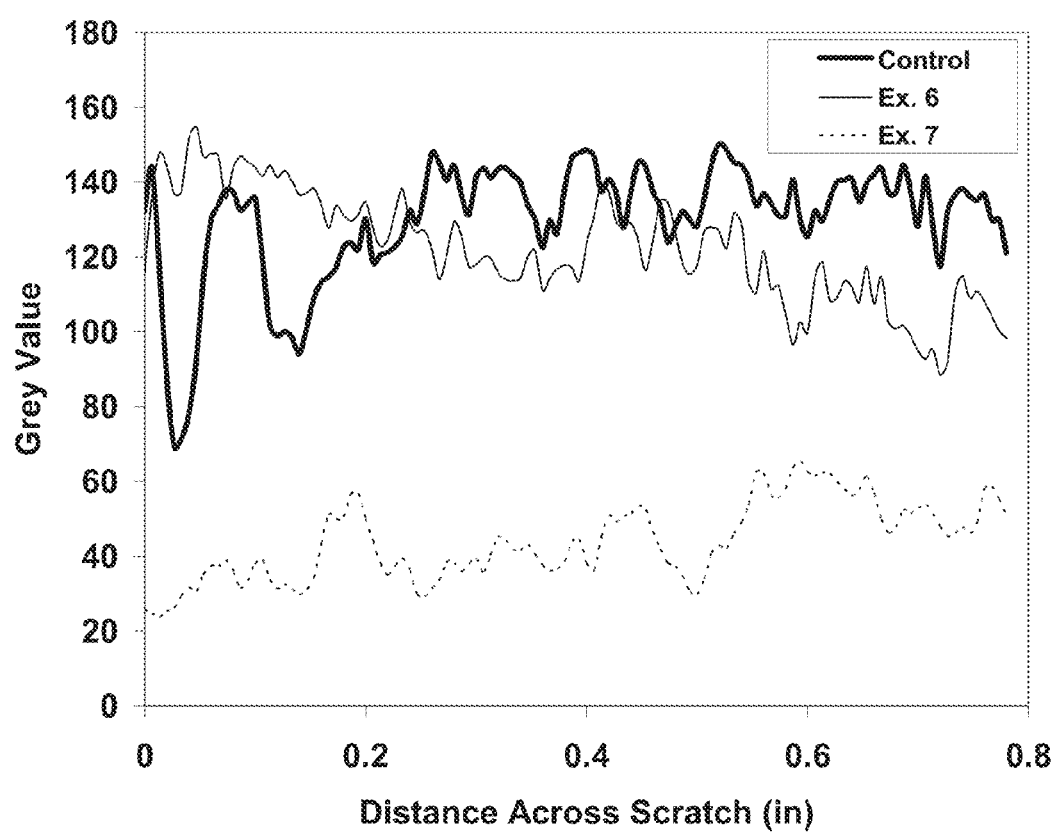
FIG. 24 is a plot of gray values of scratch scans.

A control sample (Comparative Test Plaque 1E), a low level experimental sample (Test Plaque 22C), and a high level experimental sample (Test Plaque 23C) were subjected to constant force scratch testing. A Micro-Scratch Tester (CSM Instruments) equipped with a 1 mm steel ball was used to scratch each specimen using a constant force of 15 N over a path length of 20 mm. FIG. 23 shows the resulting scratch on each Test Plaque. The control sample scratch whitens considerably. While the low level experimental sample scratch whitens in a similar manner to the control, scratch whitening is dramatically reduced for the high level experimental sample. Images of the scratched specimens were analyzed using the ImageJ software (version 1.45 s) (an image processing program available from the National Institutes of Health). Histograms of the grey values found within an area inscribed about each scratch were generated (FIG. 23). Consistent with the appearance of the scratches, the control sample and the low level experimental sample exhibit a population of lighter values while the high level experimental sample does not. The histogram data are summarized in Table 9 below. Relative to the control and the low level experimental sample, the high level experimental sample exhibits a lower mean grey value, a lower minimum and maximum grey value, and a lower mode of grey values. Further, a profile plot of the three samples is given in FIG. 24. This plot shows the grey value along the scratch from left to right as depicted in FIG. 24. The profile curve for the high level experimental sample is significantly lower than that of the control or low level sample.

TABLE 9

Parameters from Grey Value Histogram (FIG. 24)

|  | Control | Low Level | High Level |
|---|---|---|---|
| Count | 1788 | 1800 | 1812 |
| Mean | 56.99 | 60.43 | 29.51 |
| Std Dev | 34.04 | 33.22 | 8.76 |
| Min | 30 | 33 | 16 |
| Max | 170 | 164 | 70 |
| Mode | 39 (225) | 42 (241) | 25 (179) |

Control sample Comparative Test Plaque 1E, and experimental samples Test Plaque 22D and Test Plaque 23D were subjected to an impact whitening test. A Gardner impact tester fitted with a 2-lb tip was used to strike each sample successively along its length with increasing force. A visual determination was made as to the minimum force required to cause a whitening defect. While the force required to impart a whitening defect in the control sample was in the 2-4 in-lb range, the force required to impart a whitening defect in the experimental sample was in the 6-8 in-lb range indicating a resistance to whitening due to impact. This demonstrates an improvement in impact whitening for dry-blended pigment modified filler compared to pigments incorporated by traditional liquid dispersions.

Figures 25A, 25B:
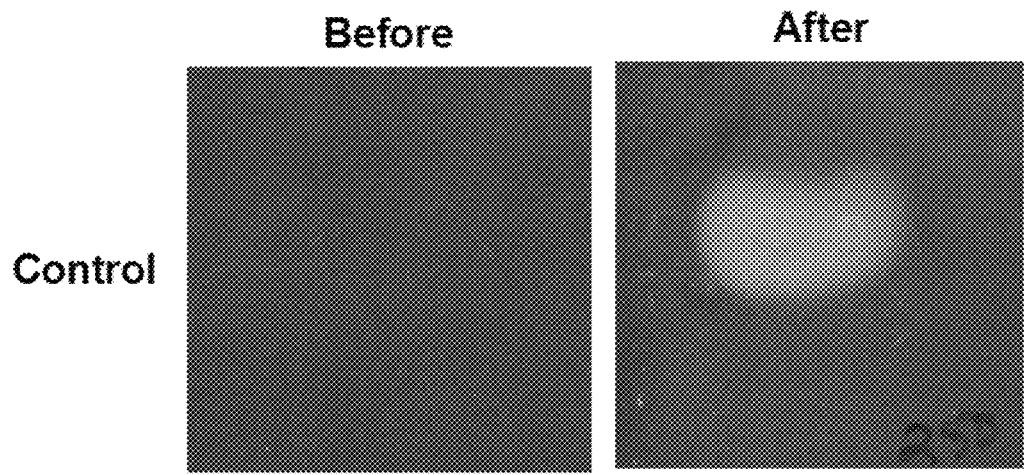
FIG. 25 are photos of Test Plaques before and after hot block testing.
Figures 25C, 25D:
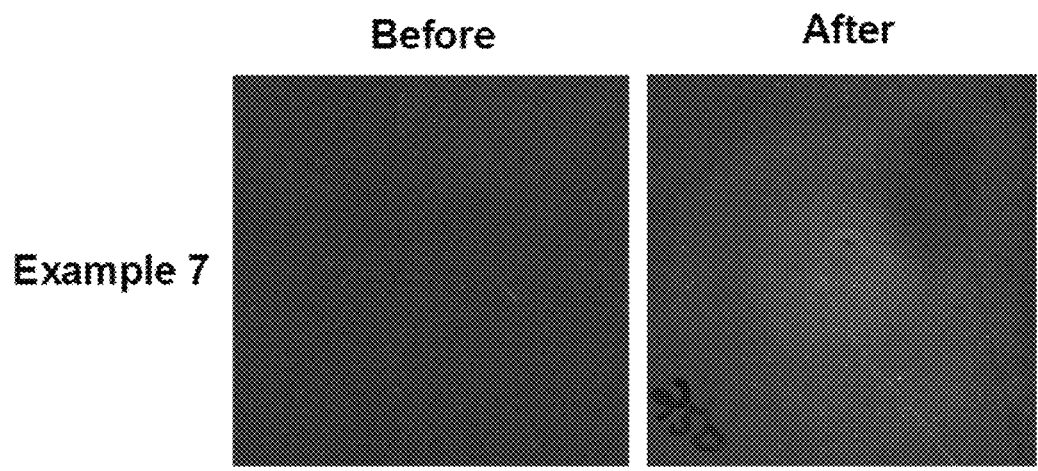
Figure 26A:
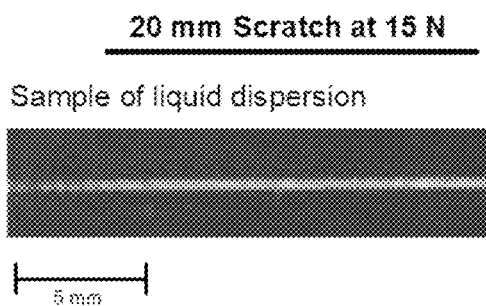
FIG. 26 (prior art) illustrates scratches on various comparative filled polymer materials and histograms of scans of the scratches.
Figure 26B:
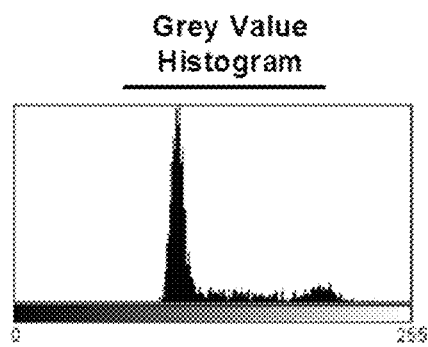
Figure 26C:
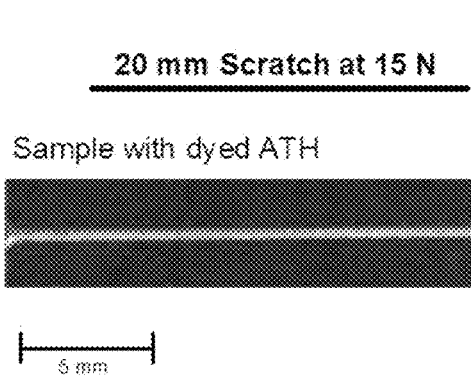
Figure 26D:
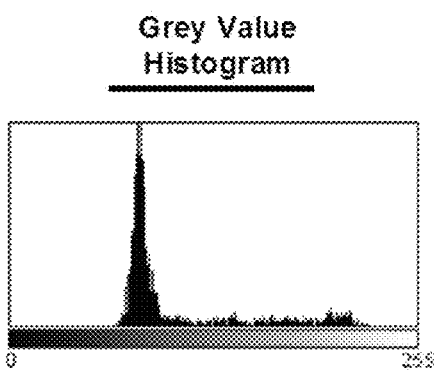

Control sample Comparative Test Plaque 1F and the experimental sample Test Plaque 23E were subjected to a temperature resistance test. A heated block, thermostatically controlled to 250° C., was placed on the surface of each sample for 5 minutes. The color of the sample where the test was conducted was read before and after. Table 10 below shows a significant difference in whitening due to incidence with high temperature for the experimental sample versus the control (3.98 versus 13.02 ΔE units). FIG. 25 depicts the appearance of each sample before and after the test. The results provided in Table 10 below show a significantly lower color change for the Test Plaque 23E as compared to the control sample of Comparative Test Plaque 1F. This demonstrates an improvement in high temperature whitening for dry-blended pigment modified filler compared to pigments incorporated by traditional liquid dispersions.

TABLE 10

Calculated Color Change After Hot Block Testing

|  | ΔE |
|---|---|
| Comparative Test Plaque 1F | 13.02 |
| Test Plaque 23E | 3.98 |

Comparative Example 2

A dyed aluminum trihydrate filler was synthesized as described in Example 2 of U.S. Pat. No. 7,863,369. A four liter reaction kettle was charged with an aqueous suspension of Alumina Trihydrate (ATH, Rio-Tinto-Alcan, WH311-540 g) in de-ionized water (3,377 g). The pH of the aqueous suspension was adjusted to ~3.5 using a dilute solution of nitric acid in water (~1 mL of a 14% solution). Reactive Red 198 powder (4.22 g, Reactive Red 198 is a triazine dye having a sulfatoethylsulfone functional group, and was obtained from Organic Dyestuffs Corp, 1015 Highway 29 N, Concord, N.C. 28025, Product No. 161980R12) was added to the reaction kettle. The resulting ATH-dye suspension was warmed to 65° C. for a one hour interval with constant stirring. The aqueous suspension was maintained at a temperature of between 60° C. and 70° C. for two hours with constant stirring. After the two hour heating interval was complete, the suspension was allowed to cool and settle overnight without stirring. Excess liquid was decanted from the settled ATH, and the moist solid obtained was dried at 60° C. to 70° C. first in a hot air oven and then under vacuum (>740 mm Hg). Any agglomerates which formed during the drying steps were broken up by ball milling with ceramic media.

A dyed-filler control sample of filled polymeric material comprised of an acrylic matrix and dyed aluminum trihydrate filler was synthesized in a 1500 mL resin kettle (10.5×23 cm) fitted with kettle top having ports for a temperature probe, air-driven stirrer, rubber septum and an Allihn™ type reflux condenser. The following ingredients were sequentially weighed into the kettle:

PMA-25 (t-Butyl Peroxymaleic Acid Paste, Arkema) 17.16 g
Aerosol-OT Surfactant (Cytec Industries) 2.74 g
TRIM (Trimethylolpropane Trimethacrylate, Sartomer) 7.46 g
MMA (Methyl Methacrylate, Lucite® International 56.07 g
Zelec® PH (unsaturated phosphoric acid ester, Stepan Co) 1.23 g
Polymer Syrup (24% PMMA~30,000 Daltons dissolved in MMA) 587.35 g
Quinacridone Red Pigment Paste (Penn Color, PC9S172) 6.84 g After mixing these ingredients using a High Speed Disperser (HSD) Blade (60 mm Diameter-INDCO Cowles Type) at 500 rpm for one minute at room temperature, 1116.0 g of dyed ATH (prepared as described above) was added portion wise over a two minute interval. During the portion wise addition of the dyed ATH, the rpm of the HSD was incrementally increased to about 1,500 rpm. After the dyed ATH addition was complete, the HSD speed was increased to 2,000 rpm and maintained for 10 minutes. The resulting mixture was then evacuated (Reflux condenser cooled to −10° C.) at 75 Torr (about 27 inches of Hg) for two minutes with 1,000 rpm stirring (3'-four blade prop). The mixture was warmed to 45° C. using a waterbath. The mixing was increased to 1,500 rpm and the following ingredients were sequentially injected via syringe in rapid succession:

De-mineralized water 0.25 g
Calcium Hydroxide (45% Suspension, DuPont) 7.21 g
Thiocure® GDMA (Glycol Dimercaptoacetate, Evans) 2.69 g The resulting slurry was allowed to mixture (1,500 rpm) at 45° C. for about 10 sec. Stirring was discontinued and the vacuum was released with air. The initiated mixture was poured into a 15 mm thick sheet casting mold within a one minute interval. The time required to achieve a peak temperature of 138° C. was approximately 6 minutes. The addition of the GDMA was considered "Time Zero". Upon cooling, the hardened, polymerized composite plaque was removed from the mold after about one hour and rough-finished on a drum sander and then sanded with progressively finer grit sand paper ending with 240-grit to create a dyed-filler control sample. After measuring the color values of the dyed-filler control sample it was sawn into four Test Plaques, Comparative Test Plaques 2A, 2B, 2C, and 2D.

Color Change Due to Hot Water Immersion (Water Blush Testing)

Comparative Test Plaque 1G as a control sample, and Comparative Test Plaque 2A as the experimental sample were subjected to a water blush test by immersion in 72° C. water for 16 hours. Color measurements were made on each sample after the immersion and ΔE values were calculated (Table 11). Comparative Test Plaque 2A (dyed ATH) exhibits a significantly larger color change after hot water immersion, compared to the control (Comparative Test Plaque 1G—liquid dispersion).

TABLE 11

Calculated Color Change after Hot Water Immersion

|  | ΔE |
|---|---|
| Comparative Test Plaque 1G | 1.99 |
| Comparative Test Plaque 2A | 9.56 |

Degree of Whitening Due to Thermobending

Comparative Test Plaque 1H as a control sample, and Comparative Test Plaque 2B as the experimental sample were subjected to a thermobending test. Each piece was heated to 160° C. in a double platen oven. Afterwards, the specimens were placed over a curved form with a 3 inch radius. The Test Plaques were allowed to cool completely in a vacuum press. The color of the center region of each Test Plaque was read before and after the test. The results provided in Table 12 below indicate that there is no significant difference in the color change due to thermobending between each sample.

TABLE 12

Calculated Color Change After Thermobending

|  | ΔE |
|---|---|
| Comparative Test Plaque 1H | 2.56 |
| Comparative Test Plaque 2B | 3.10 |

Degree of Scratch Whitening

Figure 27:
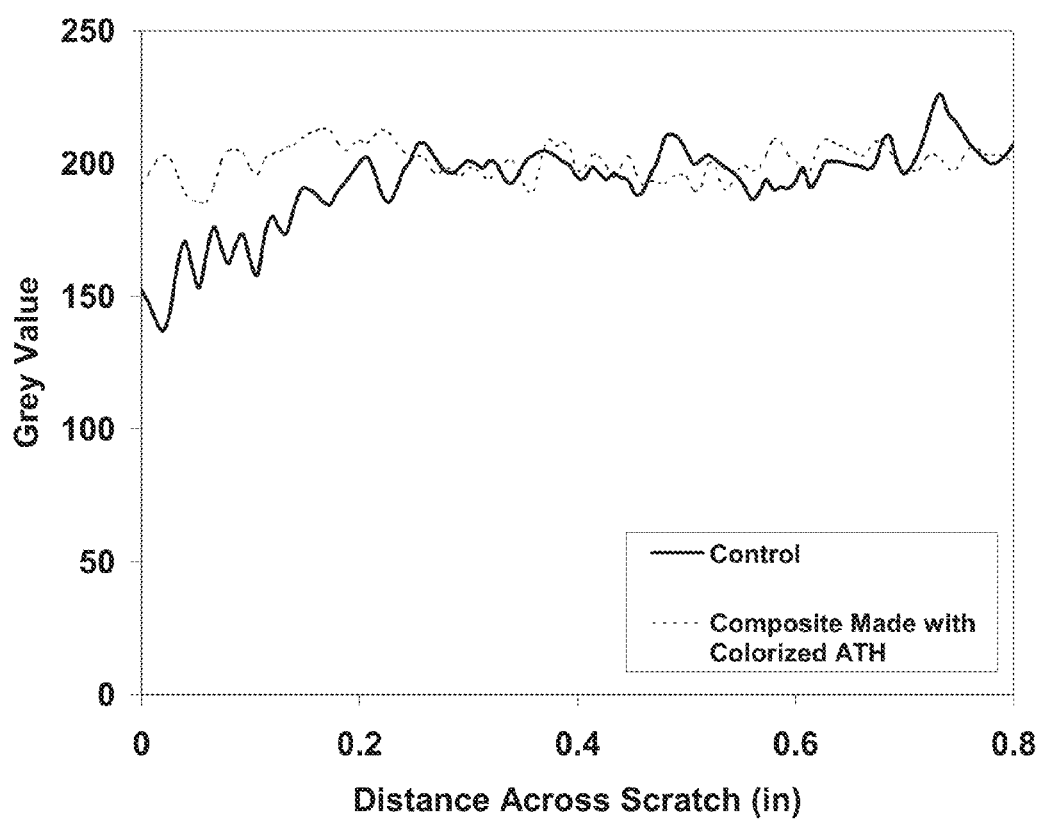
FIG. 27 (prior art) is a plot of gray values for scratches on various comparative filled polymer materials.

Comparative Test Plaque 1I and Comparative Test Plaque 2B were subjected to constant force scratch testing. A Micro-Scratch Tester (CSM Instruments) equipped with a 1 mm steel ball was used to scratch each specimen using a constant force of 15 N over a path length of 20 mm. FIG. 26 shows the resulting scratch on each specimen. Both the liquid dispersion sample (Comparative Example 1I) and the sample made using the dyed filler (Comparative Example 2B) scratch-whiten considerably. Images of the scratched Test Plaques were analyzed using the ImageJ software (version 1.45 s). Histograms of the grey values found within an area inscribed about each scratch were generated (FIG. 26). Consistent with the appearance of the scratches, both Test Plaques exhibit a significant population of lighter values. The histogram data are summarized in Table 13 below. While the mean grey value of the liquid dispersion sample is somewhat higher than the dyed ATH sample, the latter has a higher maximum grey value. A profile plot of both samples is given in FIG. 27. This plot shows the grey value along the scratch from left to right as depicted in FIG. 26. The profile curves of the scratches of the two samples are quite similar. When all of the visual data is taken together, it can be concluded that no appreciable difference in the intensity of scratch whitening exists.

TABLE 13

Parameters from Grey Value Histogram (FIG. 26)

|  | Liquid Dispersion | Dyed ATH |
|---|---|---|
| Count | 1800 | 1800 |
| Mean | 122.167 | 104.873 |
| Std Dev | 32.353 | 42.232 |
| Min | 93 | 65 |
| Max | 232 | 242 |
| Mode | 106 (127) | 80 (128) |

Degree of Whitening Due to High Temperature

Comparative Test Plaque 1J and Comparative Test Plaque 2C were subjected to a temperature resistance test. A heated block, thermostatically controlled to 250° C., was placed on the surface of each sample for 5 minutes. The color of the Test Plaques were measured after the hot block was removed. The results provided in Table 14 below indicate that there is no significant difference in the color change due to incidence with high temperature between each sample.

TABLE 14

Calculated Color Change after Hot Block Test

|  | ΔE |
|---|---|
| Comparative Test Plaque 1J | 1.99 |
| Comparative Test Plaque 2C | 9.56 |

What is claimed is:

1. A process for manufacturing filled polymeric materials comprising: mixing modified filler particles comprising filler particles blended with discreet functional particles in a high energy mixer until said discreet functional particles are bound to said filler particles and remain associated during manufacturing steps employed in manufacturing filled polymeric materials during liquid prepolymer processing, with a liquid prepolymer mixture, and curing the prepolymer mixture.

2. The process of claim 1 wherein the high energy mixer is a high shear blender.

3. A process for manufacturing filled polymeric materials comprising: mixing modified filler particles comprising filler particles blended with discreet functional particles in a high energy shaker until said discreet functional particles are bound to said filler particles and remain associated during manufacturing steps employed in manufacturing filled polymeric materials during liquid prepolymer processing, with a liquid prepolymer mixture, and curing the prepolymer mixture.

4. The process of claim 1 wherein the prepolymer mixture is an acrylic.

5. The process of claim 4 wherein the filler particle is alumina trihydrate.

6. The process of claim 5 wherein the pigment particle is carbon black.

7. The process of claim 5 wherein the pigment is an iron oxide.

* * * * *